United States Patent
Cho et al.

(10) Patent No.: US 9,437,420 B2
(45) Date of Patent: Sep. 6, 2016

(54) CAPACITORS INCLUDING AMORPHOUS DIELECTRIC LAYERS AND METHODS OF FORMING THE SAME

(71) Applicants: Samsung Electronics Co., Ltd., Suwon-si (KR); NaMLab gGmbH, Dresden (DE)

(72) Inventors: Kyu-Ho Cho, Seoul (KR); Youn-Soo Kim, Yongin-si (KR); Han-Jin Lim, Seoul (KR); Steve Knebel, Dresden (DE); Uwe Schroeder, Dresden (DE)

(73) Assignees: Samsung Electronics Co., Ltd. (KR); NaMLab gGmbH (DE)

( * ) Notice: Subject to any disclaimer, the term of this patent is extended or adjusted under 35 U.S.C. 154(b) by 12 days.

(21) Appl. No.: 14/688,564

(22) Filed: Apr. 16, 2015

(65) Prior Publication Data

US 2015/0357399 A1 Dec. 10, 2015

(30) Foreign Application Priority Data

Jun. 5, 2014 (KR) .................. 10-2014-0068191

(51) Int. Cl.
*H01L 21/00* (2006.01)
*H01L 21/02* (2006.01)
*H01L 27/108* (2006.01)
*H01L 49/02* (2006.01)

(52) U.S. Cl.
CPC ... *H01L 21/02192* (2013.01); *H01L 27/10814* (2013.01); *H01L 27/10817* (2013.01); *H01L 27/10855* (2013.01); *H01L 27/10885* (2013.01); *H01L 27/10894* (2013.01); *H01L 28/40* (2013.01)

(58) Field of Classification Search
CPC .................. H01L 21/02192; H01L 27/10814; H01L 27/10817; H01L 27/10855; H01L 27/10885; H01L 27/10894
See application file for complete search history.

(56) References Cited

U.S. PATENT DOCUMENTS

| 6,558,737 | B1 | 5/2003 | Stenzel et al. | |
|---|---|---|---|---|
| 6,897,095 | B1* | 5/2005 | Adetutu | H01L 21/82385 257/493 |
| 7,723,770 | B2* | 5/2010 | Choi | H01L 27/10852 257/296 |
| 8,003,985 | B2 | 8/2011 | Ahn et al. | |
| 8,455,672 | B2 | 6/2013 | Gordon et al. | |
| 8,481,384 | B2 | 7/2013 | Chen et al. | |
| 8,563,085 | B2 | 10/2013 | Cho et al. | |
| 2003/0224571 | A1* | 12/2003 | Iijima | H01L 28/90 438/253 |
| 2004/0072401 | A1* | 4/2004 | Iizuka | H01L 27/10811 438/240 |
| 2006/0124987 | A1* | 6/2006 | Won | H01L 21/3141 257/310 |
| 2008/0224264 | A1* | 9/2008 | Park | H01G 4/1263 257/534 |
| 2009/0309187 | A1* | 12/2009 | Choi | H01L 27/10852 257/532 |

(Continued)

FOREIGN PATENT DOCUMENTS

| JP | 2011-071528 | 4/2011 |
|---|---|---|
| JP | 4813750 | 9/2011 |

(Continued)

*Primary Examiner* — Nicholas Tobergte
(74) *Attorney, Agent, or Firm* — Myers Bigel & Sibley, P.A.

(57) ABSTRACT

A capacitor can include a crystallized metal oxide dielectric layer having a first dielectric constant and an amorphous metal oxide dielectric layer, on the crystallized metal oxide dielectric layer, where the amorphous metal oxide dielectric layer has a second dielectric constant that is less than the first dielectric constant and is greater than a dielectric constant of aluminum oxide.

20 Claims, 18 Drawing Sheets

(56) References Cited

U.S. PATENT DOCUMENTS

| | | |
|---|---|---|
| 2011/0048769 A1 | 3/2011 | Fujiwara |
| 2011/0147891 A1 | 6/2011 | Furukawa et al. |
| 2012/0171839 A1 | 7/2012 | Chen et al. |
| 2012/0276721 A1 | 11/2012 | Chung et al. |
| 2013/0217202 A1 | 8/2013 | Malhotra et al. |
| 2014/0242812 A1 | 8/2014 | Dussarrat et al. |
| 2014/0264526 A1 | 9/2014 | Brewer et al. |

FOREIGN PATENT DOCUMENTS

| | | |
|---|---|---|
| JP | 2011-236223 | 11/2011 |
| KR | 10-2008-0102625 | 11/2008 |
| KR | 10-2009-0022801 | 3/2009 |
| KR | 10-2010-0022441 | 3/2010 |
| KR | 10-1147591 | 5/2012 |
| KR | 10-2012-0122887 | 11/2012 |
| KR | 10-2013-0079591 | 7/2013 |

\* cited by examiner

CAPACITORS INCLUDING AMORPHOUS DIELECTRIC LAYERS AND METHODS OF FORMING THE SAME

CROSS-REFERENCE TO RELATED APPLICATION

This application claims priority under 35 USC §119 to Korean Patent Application No. 10-2014-0068191, filed on Jun. 5, 2014 in the Korean Intellectual Property Office (KIPO), the contents of which are herein incorporated by reference in their entirety.

FIELD

Example embodiments relate to capacitors and methods of forming the same. More particularly, example embodiments relate to capacitors having a metal-insulator-metal (MIM) structure and methods of forming the same.

BACKGROUND

When a capacitor having a MIM structure is formed, a single dielectric layer can be provided to include a high-k dielectric material, e.g., crystalline zirconium oxide between lower and upper electrodes to provide increased capacitance. The dielectric layer may, however, have a grain boundary that may cause a leakage current to be generated.

In order to prevent the formation of the grain boundary, amorphous aluminum oxide may be interposed into the dielectric layer. Thus, a dielectric layer structure including $ZrO_2/Al_2O_3/ZeO_2$ layers may be formed to reduce the leakage current. However, the amorphous aluminum oxide may have a very small dielectric constant with respect to the crystalline zirconium oxide.

SUMMARY

According to example embodiments, a capacitor can include a lower electrode on a substrate, a dielectric layer structure on the lower electrode, and an upper electrode on the dielectric layer structure. The dielectric layer structure includes a first dielectric layer and a second dielectric layer sequentially stacked. The first dielectric layer includes a first crystalline metal oxide, and the second dielectric layer includes an amorphous metal oxide having a dielectric constant less than that of the first dielectric layer but greater than that of aluminum oxide.

In example embodiments, the capacitor may further include a third dielectric layer on the second dielectric layer. The third dielectric layer may include a second crystalline metal oxide. The second dielectric layer may have a dielectric constant less than that of the third dielectric layer.

In example embodiments, the first and second crystalline metal oxides may include titanium oxide, tantalum oxide, aluminum oxide, hafnium oxide or zirconium oxide. The second dielectric layer may have a thickness less than those of the first and third dielectric layers.

In example embodiments, each of the first and third dielectric layers may have a thickness of about 5 Å to about 150 Å, and the second dielectric layer may have a thickness of about 3 Å to about 30 Å.

In example embodiments, the amorphous metal oxide may include lanthanum oxide or scandium oxide.

In example embodiments, each of the less and upper electrodes may include titanium, tungsten, tantalum, platinum, ruthenium, iridium, or an oxide thereof.

According to example embodiments, there is provided a method of forming a capacitor. In the method, a less electrode is formed on a substrate. A dielectric layer structure is formed on the less electrode. The dielectric layer structure includes a first dielectric layer and a second dielectric layer sequentially stacked. The first dielectric layer contains a first metal oxide, and the second dielectric layer contains a second metal oxide having a dielectric constant less than that of the first metal oxide in a crystallized state but greater than that of aluminum oxide. An upper electrode is formed on the dielectric layer structure.

In example embodiments, when the dielectric layer structure is formed, a third dielectric layer may be further formed on the second dielectric layer using a third metal oxide.

In example embodiments, the third metal oxide may include a material substantially the same as the first metal oxide.

In example embodiments, the second dielectric layer may be formed to have a thickness less than those of the first and third dielectric layers.

In example embodiments, each of the first and third dielectric layers may be formed to have a thickness of about 5 Å to about 150 Å, and the second dielectric layer may be formed to have a thickness of about 3 Å to about 30 Å.

In example embodiments, after forming the upper electrode, a heat treatment or a plasma treatment may be performed on the dielectric layer structure to crystallize the first and third metal oxides. In example embodiments, the amorphous metal oxide may include lanthanum oxide or scandium oxide.

In example embodiments, each of the less and upper electrodes may be formed to include titanium, tungsten, tantalum, platinum, ruthenium, iridium, an oxide thereof, or a nitride thereof.

In some embodiments, a capacitor can include a crystallized metal oxide dielectric layer having a first dielectric constant and an amorphous metal oxide dielectric layer, on the crystallized metal oxide dielectric layer, where the amorphous metal oxide dielectric layer has a second dielectric constant that is less than the first dielectric constant and is greater than a dielectric constant of aluminum oxide.

In some embodiments, the crystallized metal oxide dielectric layer can include a first crystallized metal oxide dielectric layer, where the capacitor can further include a second crystallized metal oxide dielectric layer on the amorphous metal oxide dielectric layer opposite the first crystallized metal oxide dielectric layer.

In some embodiments, the first and second crystallized metal oxide dielectric layers can each have a respective thickness of about 5 Å to about 150 Å, and wherein the amorphous metal oxide dielectric layer has a thickness of about 3 Å to about 30 Å. In some embodiments, the first dielectric constant is greater than a dielectric constant of SiN.

In some embodiments, the amorphous metal oxide dielectric layer can include lanthanum oxide or scandium oxide.

According to example embodiments, a capacitor may include a dielectric layer including amorphous lanthanum oxide or amorphous scandium oxide between dielectric layers. Each of the dielectric layers may be formed to have a thickness less than a critical thickness, so that no or very little grain boundary may be formed therein. Thus, the capacitor including the dielectric layers may have a reduced leakage current and have a high capacitance.

BRIEF DESCRIPTION OF THE DRAWINGS

Example embodiments will be more clearly understood from the following detailed description taken in conjunction with the accompanying drawings.

DESCRIPTION OF EMBODIMENTS

Figure 1:
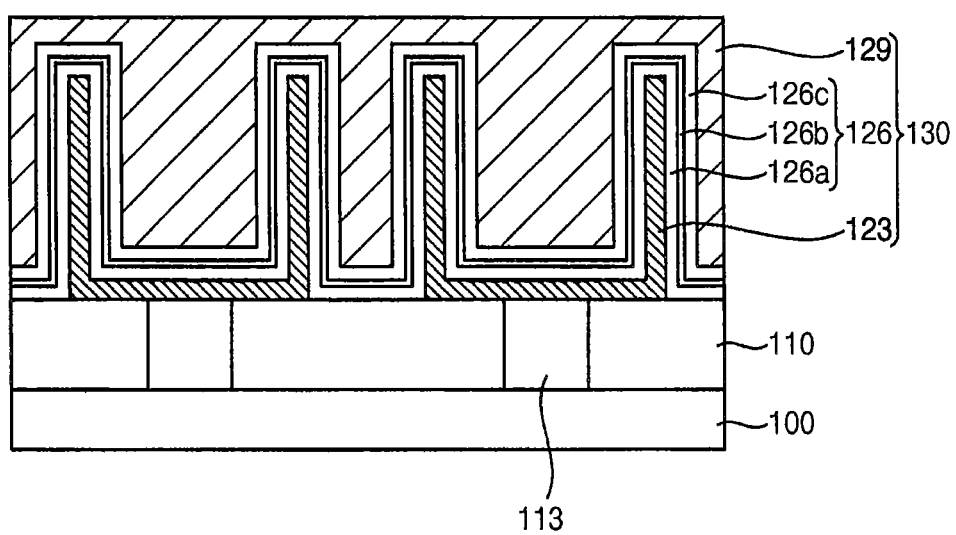
FIG. 1 is a cross-sectional view illustrating a capacitor in accordance with example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a capacitor in accordance with example embodiments.

Referring to FIG. 1, a capacitor 130 may include a lower electrode 123 electrically connected to a plug 113 that extends through an insulating interlayer 110 to a substrate 100. The capacitor 130 may further include a dielectric layer structure 126 and an upper electrode 129 sequentially stacked on the lower electrode 123 and the insulating interlayer 110.

The substrate 100 may be a silicon substrate, a germanium substrate, a silicon-germanium substrate, a silicon-on-insulator (SOI) substrate, a germanium-on-insulator (GOI) substrate, etc. Various types of elements, e.g., gate structures or impurity regions may be further formed on and/or in the substrate 100.

The insulating interlayer 110 may include an oxide. For example, the insulating interlayer 110 may include a silicon oxide such as borophosphosilicate glass (BPSG), undoped silicate glass (USG), spin on glass (SOG), etc.

The plug 113 may be formed on the substrate 100 through the insulating interlayer 110. The plug 113 may be electrically connected to the impurity regions in the substrate 100, and the lower electrode 123 may be electrically connected to the impurity regions via the plug 113. The plug 113 may include, e.g., doped polysilicon, a metal, etc.

In example embodiments, the lower electrode 123 may have a hollow cylindrical shape. Alternatively, the lower electrode 123 may have a pillar shape. The lower electrode 123 may include a metal, a conductive metal oxide and/or a metal nitride. The lower electrode 123 may include a metal, e.g., titanium, tungsten, tantalum, platinum, ruthenium, iridium, etc., or a conductive metal oxide, e.g., platinum oxide, ruthenium oxide, iridium oxide, etc. The lower electrode 123 may also include a metal nitride, e.g., titanium nitride, tantalum nitride, etc.

The dielectric layer structure 126 may include a first dielectric layer 126a, a second dielectric layer 126b and a third dielectric layer 126c sequentially stacked on the lower electrode 123 and the insulating interlayer 110.

The first dielectric layer 126a may be formed conformably on a top surface and a sidewall of the lower electrode 123 and on the insulating interlayer 110. In example embodiments, the first dielectric layer 126a may have a thickness of about 5 Å to about 150 Å.

The first dielectric layer 126a may include a first crystalline metal oxide having a dielectric constant equal to or greater than silicon nitride in a crystallized state. For example, the first crystalline metal oxide may include titanium oxide, tantalum oxide, aluminum oxide, hafnium oxide, zirconium oxide, etc. These may be used alone or in a combination thereof.

The second dielectric layer 126b may be formed on the first dielectric layer 126a. The second dielectric layer 126b may have a thickness that is less than that of the first dielectric layer 126a. In example embodiments, the second dielectric layer 126b may have a thickness of about 3 Å to about 30 Å. The second dielectric layer 126b may include an amorphous metal oxide having a dielectric constant that is less than that of the first crystalline metal oxide but greater than that of aluminum oxide. For example, the amorphous metal oxide may include scandium oxide, lanthanum oxide, etc.

The third dielectric layer 126c may be formed on the second dielectric layer 126b. The third dielectric layer 126c may have a thickness substantially the same as that of the first dielectric layer 126a, i.e., a thickness of about 5 Å to about 150 Å. The third dielectric layer 126c may include a second crystalline metal oxide having a dielectric constant equal to or greater than silicon nitride in a crystallized state. For example, the second crystalline metal oxide may include titanium oxide, tantalum oxide, aluminum oxide, hafnium oxide, zirconium oxide, etc. These may be used alone or in a combination thereof. In example embodiments, the third dielectric layer 126c may include a material substantially the same as that of the first dielectric layer 126a. That is, the second crystalline metal oxide may be substantially the same as the first crystalline metal oxide.

FIG. 1 shows the dielectric layer structure 126 includes the first, second and third dielectric layers 126a, 126b and 126c, however, in some embodiments, the third dielectric layer 126c may be absent but the first and second dielectric layers 126a and 126b may be present.

As appreciated by the present inventors, a grain boundary may be formed between the first and second crystalline metal oxides included the first and third dielectric layers 126a and 126c, respectively, if crystallized at a high temperature, which may cause a leakage current. However, in example embodiments, the dielectric layer structure 126 may further include the second dielectric layer 126b between the first and third dielectric layers 126a and 126c, and the second dielectric layer 126b may contact the first and third dielectric layers 126a and 126c to prevent or reduce the formation of the grain boundary.

Furthermore, if the dielectric layer structure 126 includes only one layer, if the layer has a thickness greater than a particular thickness, a grain boundary may be generated which can increase the leakage current. However, if the dielectric layer structure 126 includes a plurality of layers each of which may have a thickness that is less than the particular thickness, no grain boundary may be generated in each layer, so that a leakage current may be prevented.

Alternatively, if the dielectric layer structure 126 is too thin, the leakage current may also increase. However, if the dielectric layer structure 126 has a plurality of layers, the dielectric layer structure 126 may have a thick total thickness that is increased, which may prevent the leakage current. The second dielectric layer 126b may be formed between the first and third dielectric layers 126a and 126c so that each of the first, second and third dielectric layers 126a, 126b and 126c may be formed to have a thickness less than a critical thickness to prevent the formation of grain boundaries between crystals therein. Thus, the added thickness of the structure due to the second dielectric layer 126b may prevent the grain boundary formation. Further, even if the dielectric layer structure 126 may not include the third dielectric layer 126c, the second dielectric layer 126b formed on the first dielectric layer 126a may prevent the formation of grain boundaries between the first metal oxide crystals included in the first dielectric layer 126a, and thus the leakage current may be also prevented or reduced.

The second dielectric layer 126b may include a material having a dielectric constant that may be substantially the same as the dielectric of the materials in the first and third dielectric layers 126a and 126c, which may include, e.g., scandium oxide, lanthanum oxide, etc. Thus, the capacitor 130 including the dielectric layer structure 126 may have a high capacitance.

The upper electrode 129 may include a metal, a conductive metal oxide and/or a metal nitride. The upper electrode 129 may include a metal, e.g., titanium, tungsten, tantalum, platinum, ruthenium, iridium, etc., or a conductive metal oxide, e.g., platinum oxide, ruthenium oxide, iridium oxide, etc. The upper electrode 129 may also include a metal nitride, e.g., titanium nitride, tantalum nitride, etc.

The upper electrode 129 may have a planar top surface as shown in FIG. 1. Alternatively, the upper electrode 129 may be conformally formed on the dielectric layer structure 126.

In the capacitor 130 in accordance with example embodiments, the second dielectric layer 126b including an amorphous metal having a dielectric constant substantially the same as those of the first and second crystalline metal oxides included in the first and third dielectric layers 126a and 126c may be formed between the first and third dielectric layers 126a and 126c. Thus, no or very little grain boundary may be formed in the dielectric layer structure 126 which prevent the leakage current from being generated therein, and the capacitor 130 may have a high capacitance.

FIGS. 2 to 9 are cross-sectional views illustrating the formation of a capacitor in accordance with example embodiments.

Figure 2:
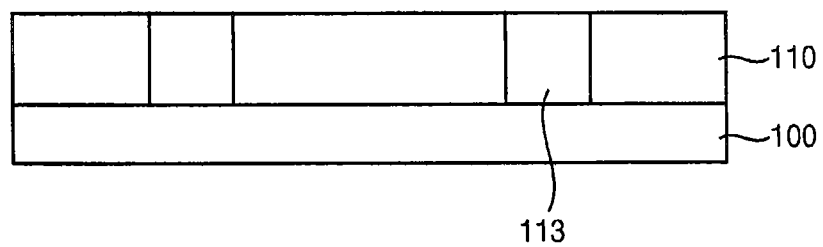
FIGS. 2 to 9 are cross-sectional views illustrating the formation of a capacitor in accordance with example embodiments.

Referring to FIG. 2, an insulating interlayer 110 may be formed on a substrate 100, and a plug 113 may be formed on the substrate 100 through the insulating interlayer 110.

The substrate 100 may be a semiconductor substrate, e.g., a silicon substrate, a germanium substrate, etc., or an SOI substrate. Various types of elements, e.g., gate structures or impurity regions may be formed on and/or in the substrate 100.

The plug 113 may be formed by forming a hole through the insulating interlayer 110 to expose a top surface of the substrate 100, forming a conductive layer on the exposed top surface of the substrate 100 and the insulating interlayer 110 to fill the hole, and planarizing an upper portion of the conductive layer until a top surface of the insulating interlayer 110 may be exposed. The conductive layer may be formed to include, e.g., doped polysilicon, a metal by, e.g., a chemical vapor deposition (CVD) process, an atomic layer deposition (ALD) process, a physical vapor deposition (PVD) process, etc. The planarization process may include a chemical mechanical polishing (CMP) process and/or an etch back process.

The plug 113 may be formed to be electrically connected to the impurity regions in the substrate 100, and a lower electrode 153 (refer to FIGS. 4 and 5) may be electrically connected to the impurity regions via the plug 113.

Figure 3:
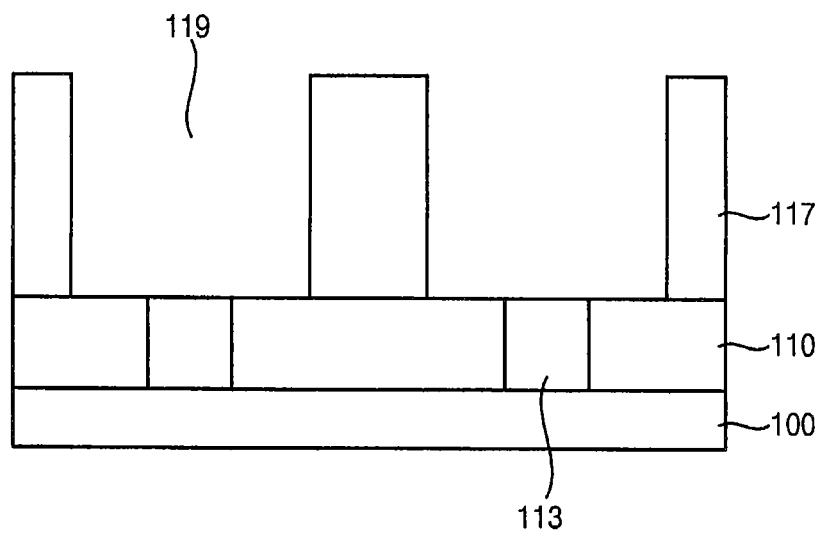

Referring to FIG. 3, a mold layer 117 may be formed on the insulating interlayer 110 and the plug 113.

The mold layer 117 may be formed to include an oxide, e.g., propylene oxide (PDX), plasma tetra ethyl ortho silicate (PTEOS), borophospho silicate glass (BPSG), phospho silicate glass (PSG), etc., by a CVD process, a PVD process, etc. Before forming the mold layer 117, an etch stop layer may be further formed on the insulating interlayer 110 and the plug 113.

The mold layer 117 may be partially removed to form an opening 119 exposing a top surface of the plug 113. The opening 119 may also partially expose a top surface of the insulating interlayer 110.

In example embodiments, the opening 119 may be formed by a dry etch process using a photoresist pattern. When the etch stop layer is formed, after removing the mold layer 117 until the etch stop layer may be exposed by a first dry etch process using a first etching gas, the exposed etch stop layer may be removed by a second dry etch process using a second etching gas to expose the top surface of the plug 113. In example embodiments, the first etching gas may include, e.g., hydrogen fluoride (HF), and the second etching gas may include, e.g., $CHF_3$, $CF_4$, $C_2F_6$, $NF_3$, etc. When the etch stop layer is not formed, the opening 119 may be formed by a dry etch process using the first etching gas.

Figure 4:
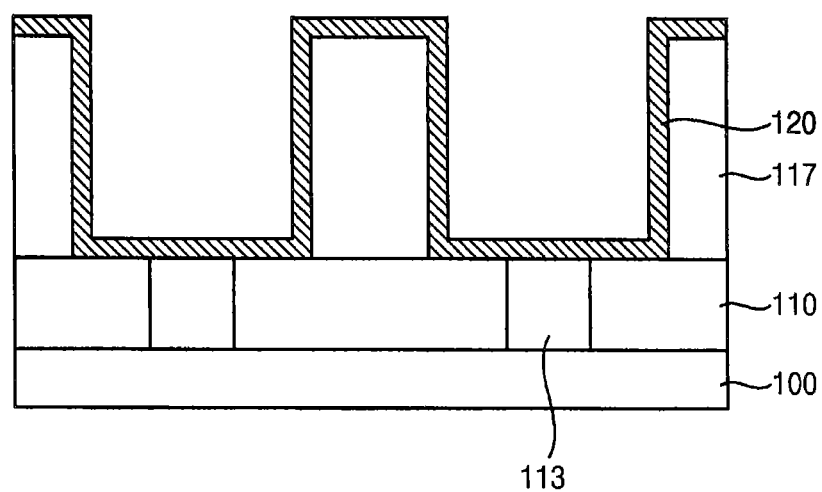

Referring to FIG. 4, a lower electrode layer 120 may be conformally formed on a sidewall of the opening 119, the exposed top surface of the plug 113, the top surface of the insulating interlayer 110, and the top surface of the mold layer 117.

The lower electrode layer 120 may be formed to include a metal, a conductive metal oxide and/or a metal nitride. The lower electrode layer 120 may be formed to include a metal, e.g., titanium, tungsten, tantalum, platinum, ruthenium, iridium, etc., or a conductive metal oxide, e.g., platinum oxide, ruthenium oxide, iridium oxide, etc. The lower electrode layer 120 may be formed to also include a metal nitride, e.g., titanium nitride, tantalum nitride, etc. The lower electrode layer 120 may be formed by a CVD process, an ALD process, a plasma enhanced atomic layer deposition (PEALD) process, etc.

Figure 5:
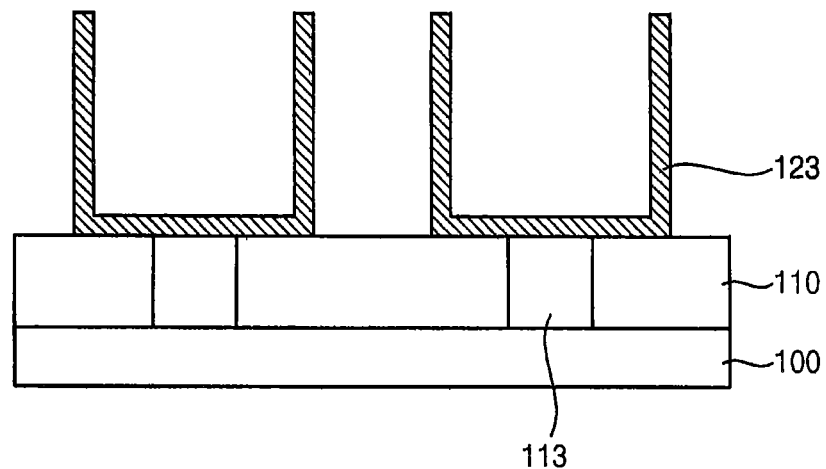

Referring to FIG. 5, a portion of the lower electrode layer 120 on the top surface of the mold layer 117 may be removed to form a plurality of lower electrodes 123. The mold layer 117 may be removed, and a top surface of the insulating interlayer 110 may be exposed.

In example embodiments, the plurality of lower electrodes 123 may be formed by a CMP process and/or an etch back process. The mold layer 117 may be removed by a wet etch process using, e.g., ammonia, hydrofluoric acid, etc.

Figure 6:
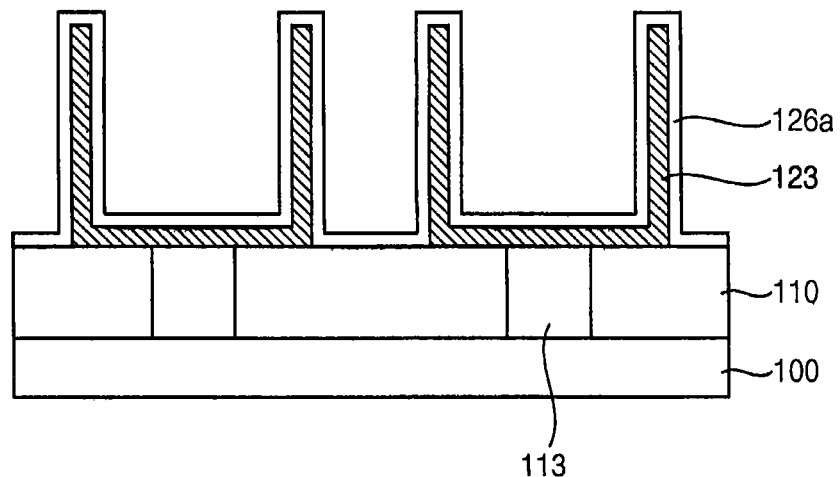

Referring to FIG. 6, a first dielectric layer 126a may be formed on the lower electrodes 123.

Particularly, the first dielectric layer 126a may be formed on the lower electrodes 123 and the exposed top surface of the insulating interlayer 110. In example embodiments, the first dielectric layer 126a may be formed to have a thickness of about 5 Å to about 150 Å.

The first dielectric layer 126a may be formed to include a first metal oxide having a dielectric constant equal to or greater than silicon nitride in a crystallized state. For example, the first metal oxide may include titanium oxide, tantalum oxide, aluminum oxide, hafnium oxide, zirconium oxide, etc. These may be used alone or in a combination thereof. The first dielectric layer 126a may be formed by a CVD process, a PVD process, an ALD process, etc.

Figure 7:
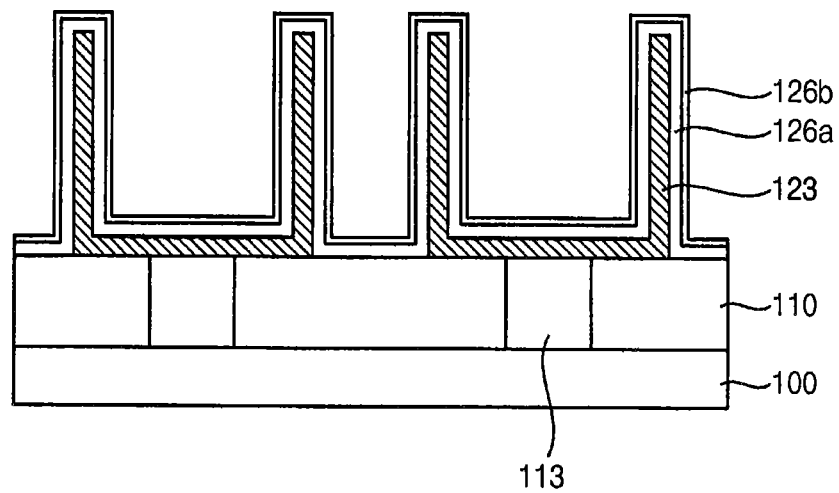

Referring to FIG. 7, a second dielectric layer 126b may be formed on the first dielectric layer 126a.

The second dielectric layer 126b may be formed to have a thickness less than that of the first dielectric layer 126a. In example embodiments, the second dielectric layer 126b may be formed to have a thickness of about 3 Å to about 30 Å. The second dielectric layer 126b may be formed to include a second metal oxide having a dielectric constant that is less than that of the first metal oxide but greater than that of aluminum oxide. For example, the second metal oxide may include scandium oxide, lanthanum oxide, etc. The second dielectric layer 126b may be formed by a sputtering process, an ALD process, a PVD process, etc., using the second metal oxide.

Figure 8:
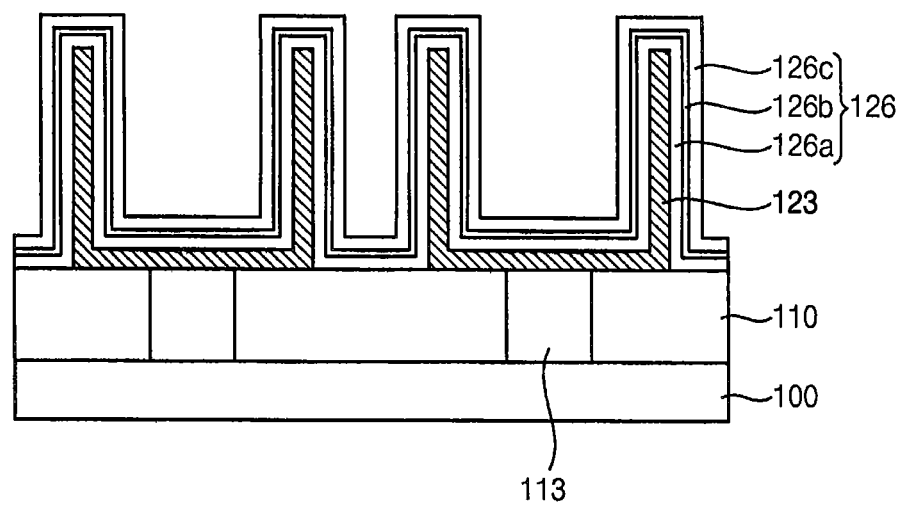

Referring to FIG. 8, a third dielectric layer 126c may be formed on the second dielectric layer 126b to complete the dielectric layer structure 126.

In example embodiments, the third dielectric layer 126c may be formed to have a thickness substantially the same as that of the first dielectric layer 126a, i.e., a thickness of about 5 Å to about 150 Å. The third dielectric layer 126c may be formed to include a third metal oxide having a dielectric constant equal to or greater than silicon nitride in a crystallized state. For example, the third metal oxide may include titanium oxide, tantalum oxide, aluminum oxide, hafnium oxide, zirconium oxide, etc. These may be used alone or in a combination thereof. In example embodiments, the third dielectric layer 126c may be formed to include a material substantially the same as that of the first dielectric layer 126a. That is, the third metal oxide may be substantially the same as the first metal oxide.

Thus, the dielectric layer structure 126 including the first, second and third dielectric layers 126a, 126b and 126c sequentially stacked may be formed. In the present embodiment, the dielectric layer structure 126 may include the first, second and third dielectric layers 126a, 126b and 126c, however, alternatively, the dielectric layer structure 126 may not include the third dielectric layer 126c.

Figure 9:
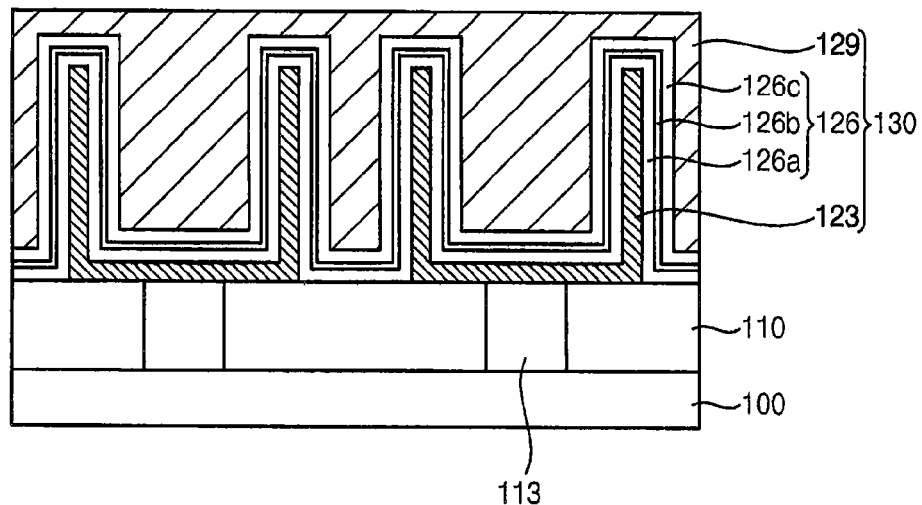

Referring to FIG. 9, an upper electrode 129 may be formed on the dielectric layer structure 126 to complete the capacitor 130.

The upper electrode 129 may be formed to include a metal, a conductive metal oxide and/or a metal nitride. The upper electrode 129 may be formed to include a metal, e.g., titanium, tungsten, tantalum, platinum, ruthenium, iridium, etc., or a conductive metal oxide, e.g., platinum oxide, ruthenium oxide, iridium oxide, etc. The upper electrode 129 may be formed to also include a metal nitride, e.g., titanium nitride, tantalum nitride, etc. The upper electrode 129 may be formed by a CVD process, a PVD process, an ALD process, etc. The upper electrode 129 may be formed to have a planar top surface as shown in FIG. 9. Alternatively, the upper electrode 129 may be conformally formed on the dielectric layer structure 129.

After forming the upper electrode 129, a heat treatment or a plasma treatment may be performed on the dielectric layer structure 126 so that the first and third metal oxides may be crystallized to be converted into first and second crystalline metal oxides, respectively. That is, the first dielectric layer 126a may be formed to include the first crystalline metal oxide, and the third dielectric layer 126c may be formed to include the second crystalline metal oxide. The second metal oxide may not be crystallized. Hereinafter, the second metal oxide that is not crystallized may be referred to as an amorphous metal oxide.

In the method of forming the capacitor 130, the dielectric layer structure 126 may be formed to include the second dielectric layer 126b between the first and third dielectric layers 126a and 126c, and the second dielectric layer 126b may contact the first and third dielectric layers 126a and 126c to prevent or reduce the formation of grain boundaries. That is, the second dielectric layer 126b may be interposed between the first and third dielectric layers 126a and 126c, and thus a space to form grain boundaries in the first and second crystalline metal oxides may not be easily formed. Thus, the second dielectric layer 126b may prevent the leakage current caused by the grain boundaries. The second dielectric layer 126b may be formed to include a material having a dielectric constant that is substantially the same as those of the first and third dielectric layers 126a and 126c, which may include, e.g., scandium oxide, lanthanum oxide, etc. Thus, the capacitor 130 including the dielectric layer structure 126 may have a high capacitance.

Figure 10:
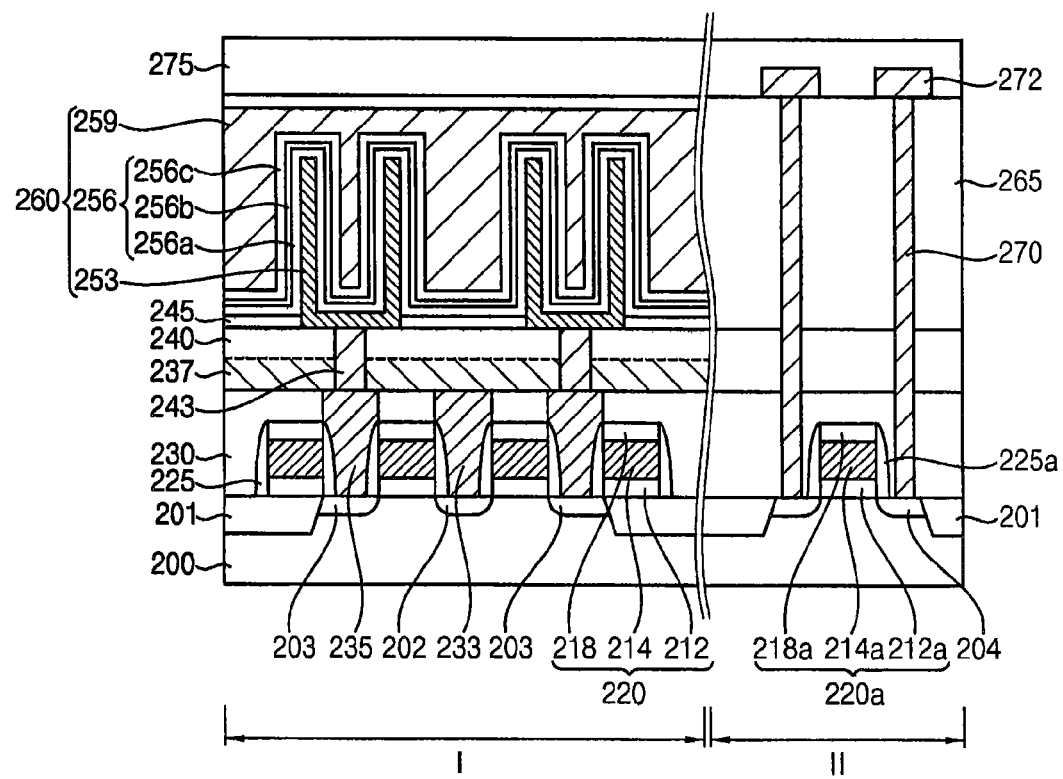
FIG. 10 is a cross-sectional view illustrating a semiconductor device in accordance with example embodiments.

FIG. 10 is a cross-sectional view illustrating a semiconductor device in accordance with example embodiments. The semiconductor device may include a structure substantially the same as or similar to the capacitor illustrated with reference to FIG. 1. That is, the semiconductor device may be a dynamic random access memory (DRAM) device including the capacitor of FIG. 1, and the capacitor of FIG. 1 may be formed in a cell region I of the DRAM device.

Referring to FIG. 10, the semiconductor device may include a first gate structure 220, first and second impurity regions 202 and 203, and first and second contact plugs 233 and 235 in a first region I of a substrate 200, and a second gate structure 220a and a third impurity region 204 in a second region II of the substrate 200. The semiconductor device may further include first and second gate spacers 225 and 225a on sidewalls of the first and second gate structures 220 and 220a, respectively, a bit line 237, a third contact plug 243 and a capacitor 260 in the first region I of the substrate 200, and a fourth contact plug 270 and a wiring 272 in the second region II of the substrate 200.

The substrate 200 may be a semiconductor substrate or an SOI substrate. The substrate 200 may be divided into the first and second regions I and II, and the first region I may serve as a cell region and the second region II may serve as a peripheral circuit region. The substrate 200 may further include a well region doped with n-type impurities or p-type impurities.

An isolation layer 201 may be formed on the substrate 200, so that the substrate 200 may be divided into an active region and a field region. The isolation layer 201 may include an insulating material, e.g., silicon oxide.

The first gate structure 220 may include a first gate insulation layer pattern 212, a first gate electrode 214 and a first gate mask 218 sequentially stacked on the substrate 200. The first gate insulation layer pattern 212 may include, e.g., silicon oxide and/or a metal oxide, the first gate electrode 214 may include, e.g., doped polysilicon, a metal, a metal nitride, a metal silicide, etc., and the first gate mask 218 may include, e.g., silicon nitride.

The second gate structure 220a may include a second gate insulation layer pattern 212a, a second gate electrode 214a and a second gate mask 218a sequentially stacked on the substrate 200. In example embodiments, the second gate insulation layer pattern 212a, the second gate electrode 214a and the second gate mask 218a may include materials substantially the same as those of the first gate insulation layer pattern 212, the first gate electrode 214 and the first gate mask 218, respectively.

The first and second gate spacers 225 and 225a may include, e.g., silicon nitride and/or silicon oxide.

The first and second impurity regions 202 and 203 may be formed at upper portions of the substrate 200 adjacent to the first gate structure 220. The third impurity region 204 may be formed at an upper portion of the substrate 200 adjacent to the second gate structure 220a.

The first gate structure 220, the first and second impurity regions 202 and 203 in the first region I of the substrate 200 may form a cell transistor. The second gate structure 220a and the third impurity region 204 in the second region II of the substrate 200 may form a peripheral circuit transistor.

The first and second gate structures 220 and 220a may be covered by a first insulating interlayer 230, and the first and second contact plugs 233 and 235 may be formed through the first insulating interlayer 230 to contact top surfaces of the first and second impurity regions 202 and 203, respectively. The first insulating interlayer 230 may include an insulating material, e.g., silicon oxide, and the first and second contact plugs 233 and 235 may include, e.g., a metal, a metal nitride, a metal silicide, etc.

The bit line 237 may be formed on the first insulating interlayer 230 to contact a top surface of the first contact plug 233. The bit line 237 may be covered by a second insulating interlayer 240, and the second insulating interlayer 240 may be formed on the first insulating interlayer 230. The bit line 237 may include, e.g., a metal, a metal nitride, a metal silicide, and the second insulating interlayer 240 may include an insulating material, e.g., silicon oxide.

The third contact plug 243 may be formed through the second insulating interlayer 240 to contact the second contact plug 235. Alternatively, the third contact plug 243 may be formed through the first and second insulating interlayers 230 and 240 to contact the second impurity region 203. In this case, the second contact plug 235 may not be formed. The third contact plug 243 may include, e.g., a metal, a metal nitride, a metal silicide, etc.

An etch stop layer 245 not covering the third contact plug 243 may be formed on the second insulating interlayer 240. The etch stop layer 245 may include, e.g., silicon nitride.

The capacitor 260 may be electrically connected to the third contact plug 243. The capacitor 260 may include a lower electrode 253, a dielectric layer structure 256 and an upper electrode 259 sequentially stacked. The lower electrode 253 may contact a top surface of the third contact plug 243. In example embodiments, the lower electrode 253 may have a hollow cylindrical shape. Alternatively, the lower electrode 253 may have a pillar shape. The dielectric layer structure 256 may be formed on the etch stop layer 245 and the lower electrode 253, and the upper electrode 259 may be formed on the dielectric layer structure 256.

The lower and upper electrodes 253 and 259 may include a metal, e.g., titanium, tungsten, tantalum, platinum, ruthenium, iridium, etc., a conductive metal oxide and/or a metal nitride.

The dielectric layer structure 256 may include first, second and third dielectric layers 256a, 256b and 256c sequentially stacked.

The first and third dielectric layers 256a and 256c may include first and second crystalline metal oxides, respectively, each of which may have a dielectric constant equal to or greater than that of silicon nitride in a crystallized state. In example embodiments, the first and third dielectric layers 256a and 256c may include, e.g., titanium oxide, tantalum oxide, aluminum oxide, hafnium oxide, zirconium oxide, etc. The second dielectric layer 256b may include an amorphous metal oxide having a dielectric constant that is less than those of the first and second crystalline metal oxides but greater than that of aluminum oxide. For example, the second dielectric layer 256b may include scandium oxide, lanthanum oxide, etc.

A third insulating interlayer 265 may be formed on the second insulating interlayer 240 and cover the capacitor 260. The third insulating interlayer 265 may include, e.g., silicon oxide.

The fourth contact plug 270 may be formed through the first, second and third insulating interlayers 230, 240 and 265 to contact the third impurity region 204 in the second region II of the substrate 200. The wiring 272 may be formed on the third insulating interlayer 265 to contact the fourth contact plug 270. The wiring 272 and the fourth contact plug 270 may serve as a portion of peripheral circuits. The fourth contact plug 270 and the wiring 272 may include, e.g., a metal, a metal nitride, a metal silicide, etc.

An upper insulation layer 275 may be formed on the third insulating interlayer 265 to cover the wiring 272. The upper insulation layer 275 may protect the wiring 272 and the peripheral circuits, and may include an insulating material, e.g., silicon oxide.

The first to fourth contact plugs 233, 235, 243 and 270 may not have the layout shown in FIG. 10, but may have various other layouts.

In the capacitor 260 in accordance with example embodiments, the second dielectric layer 256b may be formed between the first and third dielectric layers 256a and 256c to include a material having a dielectric constant that is substantially the same as those of the first and third dielectric layers 256a and 256c. Thus, no or very little grain boundaries may be formed in the dielectric layer structure 256 so as to prevent the leakage current, and the capacitor 260 including the dielectric layer structure 256 may have a high capacitance.

FIGS. 11 to 20 are cross-sectional views illustrating the formation of a semiconductor device in accordance with example embodiments. This method may be used for manufacturing the semiconductor device of FIG. 10, however, may not be limited thereto. This method may include processes substantially the same as or similar to those illustrated with reference to FIGS. 2 to 9.

Figure 11:
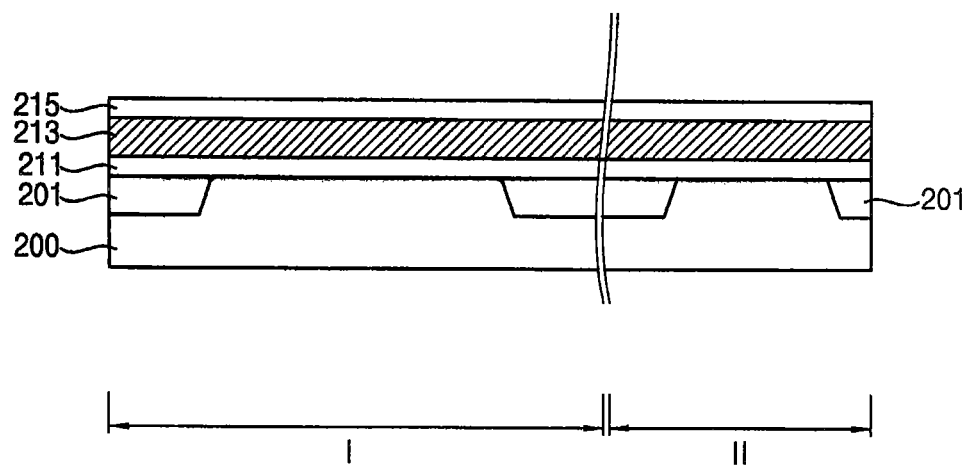
FIGS. 11 to 20 are cross-sectional views illustrating stages the formation of a semiconductor device in accordance with example embodiments.

Referring to FIG. 11, a gate insulation layer 211, a gate electrode layer 213 and a mask layer 215 may be sequentially formed on a substrate 200.

The substrate 200 may be a semiconductor substrate, e.g., a silicon substrate, a germanium substrate, etc., or an SOI substrate. The substrate 200 may be divided into a first region I and a second region II, and the first region I may serve as a cell region and the second region II may serve as a peripheral circuit region. The substrate 20Q may further include a well region doped with p-type impurities or n-type impurities.

An isolation layer 201 may be formed on the substrate 200 by, e.g., a shallow trench isolation (STI) process. The substrate 200 may be divided into an active region and a field region by the isolation layer 201.

The gate insulation layer 211 may be formed using silicon oxide or a metal oxide by a CVD process, a spin coating process, etc. Alternatively, the gate insulation layer 211 may be formed by a thermal oxidation process on a top surface of the substrate 200.

The gate electrode layer 213 may be formed using a metal and/or a metal nitride, e.g., tungsten, tungsten nitride, titanium, titanium nitride, aluminum, aluminum nitride, etc., or doped polysilicon by an ALD process, a sputtering process, a PVD process, etc.

The mask layer 215 may be formed using, e.g., silicon nitride, silicon oxynitride, etc., by a CVD process, a spin coating process, etc.

Figure 12:
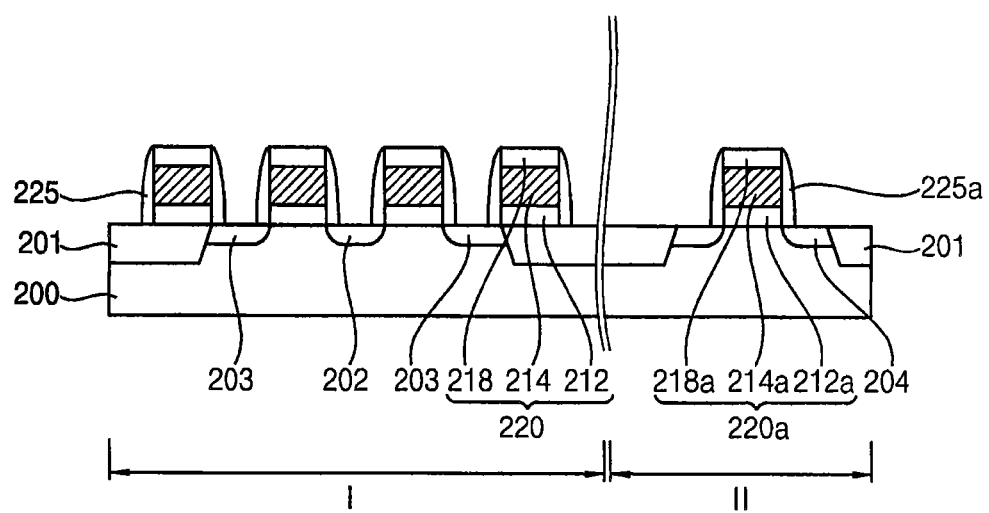

Referring to FIG. 12, the mask layer 215, the gate electrode layer 213 and the gate insulation layer 211 may be etched to form first and second gate structures 220 and 220a in the first and second regions I and II, respectively.

Particularly, the mask layer 215 may be partially removed by a photolithography process to form first and second gate masks 218 and 218a in the first and second regions I and II, respectively. The gate electrode layer 213 and the gate insulation layer 211 may be patterned using the first and second gate masks 218 and 218a. Thus, the first gate structure 220 including a first gate insulation layer pattern 212, a first gate electrode 214 and the first gate mask 218 sequentially stacked may be formed in the first region I, and the second gate structure 220a including a second gate insulation layer pattern 212a, a second gate electrode 214a and the second gate mask 218a sequentially stacked may be formed in the second region II.

An ion implantation process may be performed using the gate structures 220 and 220a as an ion implantation mask to form impurity regions at upper portions of the substrate 200 adjacent to the gate structures 220 and 220a. Particularly, first and second impurity regions 202 and 203 may be formed at upper portions of the substrate 200 adjacent to the first gate structure 220 in the first region I, and a third impurity region 204 may be formed at an upper portion of the substrate 200 adjacent to the second gate structure 220a in the second region II.

The first gate structure 220, the first impurity region 202 and the third impurity region 203 may form a cell transistor in the first region I. The second gate structure 220a and the third impurity region 204 may form a peripheral circuit transistor in the second region II. The first, second and third impurity regions 202, 203 and 204 may serve as source/drain regions of the transistors.

First and second gate spacers 225 and 225a may be formed on sidewalls of the first and second gate structures 220 and 220a, respectively. For example, a spacer layer may be formed on the substrate 200 to cover the first and second gate structures 220 and 220a, and the spacer layer may be anisotropically etched to form the first and second gate spacers 225 and 225a, respectively. The spacer layer may be formed to include, e.g., silicon nitride or silicon oxynitride by a CVD process, a spin coating process, etc.

Figure 13:
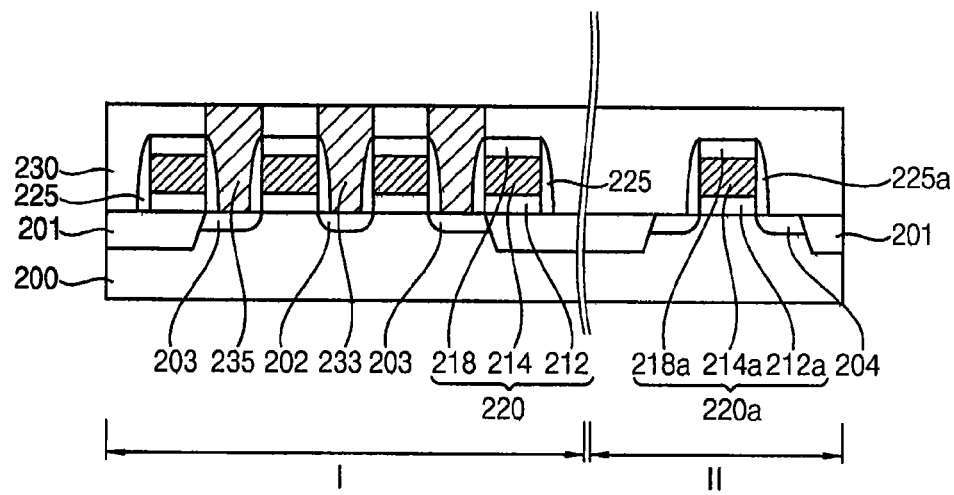

Referring to FIG. 13, a first insulating interlayer 230 may be formed on the substrate 200 to cover the first and second gate structures 220 and 220a. The first insulating interlayer 230 may be formed to include an insulating material, e.g., silicon oxide by a CVD process.

First and second contact plugs 233 and 235 may be formed through the first insulating interlayer 230 to contact the first and second impurity regions 202 and 203, respectively.

For example, a portion of the first insulating interlayer 230 in the first region I may be etched to form first holes exposing the first and second impurity regions 202 and 203, respectively. A first conductive layer may be formed on the exposed first and second impurity regions 202 and 203 and the first insulating interlayer 230 to fill the first holes, and may be planarized until a top surface of the first insulating interlayer 230 may be exposed to form the first and second contact plugs 233 and 235. The first conductive layer may be formed using a metal, e.g., tungsten, copper, aluminum, etc., and/or a metal nitride by a sputtering process, an ALD process, a PVD process, etc. The planarization process may be performed by a CMP process and/or an etch back process.

Figure 14:
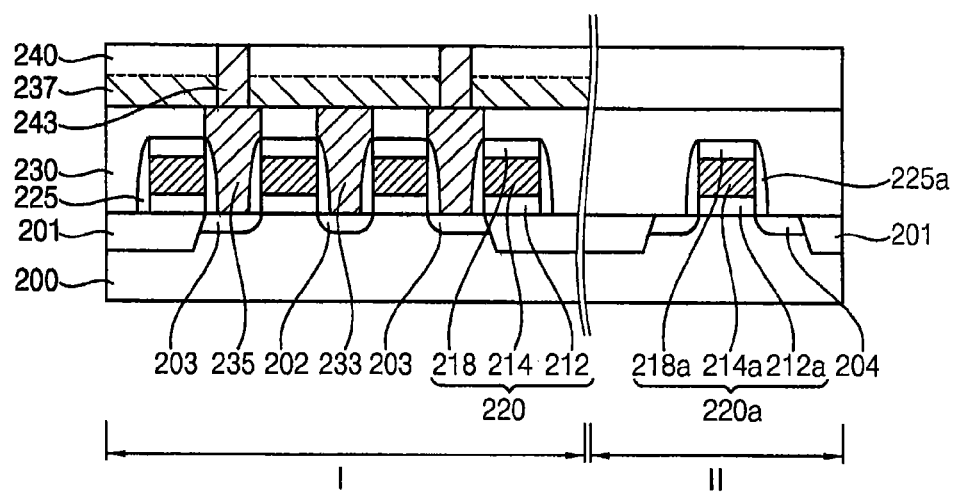

Referring to FIG. 14, a bit line 237 may be formed to be electrically connected to the first contact plug 233. Particularly, a second conductive layer may be formed on the first insulating interlayer 230 to contact the first contact plug 233, and may be patterned to form the bit line 237. The first contact plug 233 may be electrically connected to the bit line 237.

A second insulating interlayer 240 may be formed on the first insulating interlayer 230 to cover the bit line 237. The second insulating interlayer 240 may be formed in both of the first and second regions I and II of the substrate 200. The second insulating interlayer 240 may be formed to include an insulating material, e.g., silicon oxide by a CVD process, a spin coating process, etc.

A third contact plug 243 may be formed through the second insulating interlayer 240 to be electrically connected to the second contact plug 235. For example, the second insulating interlayer 240 may be partially removed to form a second hole exposing the second contact plug 235. A third conductive layer may be formed on the exposed second contact plug 235 and the second insulating interlayer 240 to fill the second hole, and planarized until a top surface of the second insulating interlayer 240 may be exposed to form the third contact plug 243.

The second and third contact plugs 235 and 243 may be electrically connected to a capacitor 260 (refer to FIG. 20) subsequently formed. Alternatively, the second contact plug 235 may not be formed, but the third contact plug 243 may be formed through the first and second insulating interlayers 230 and 240 to contact the second impurity region 203. In this case, the third contact plug 243 alone may be electrically connected to the capacitor 260.

The second and third conductive layers may be formed using a metal and/or a metal nitride by a sputtering process, an ALD process, a PVD process, etc.

Figure 15:
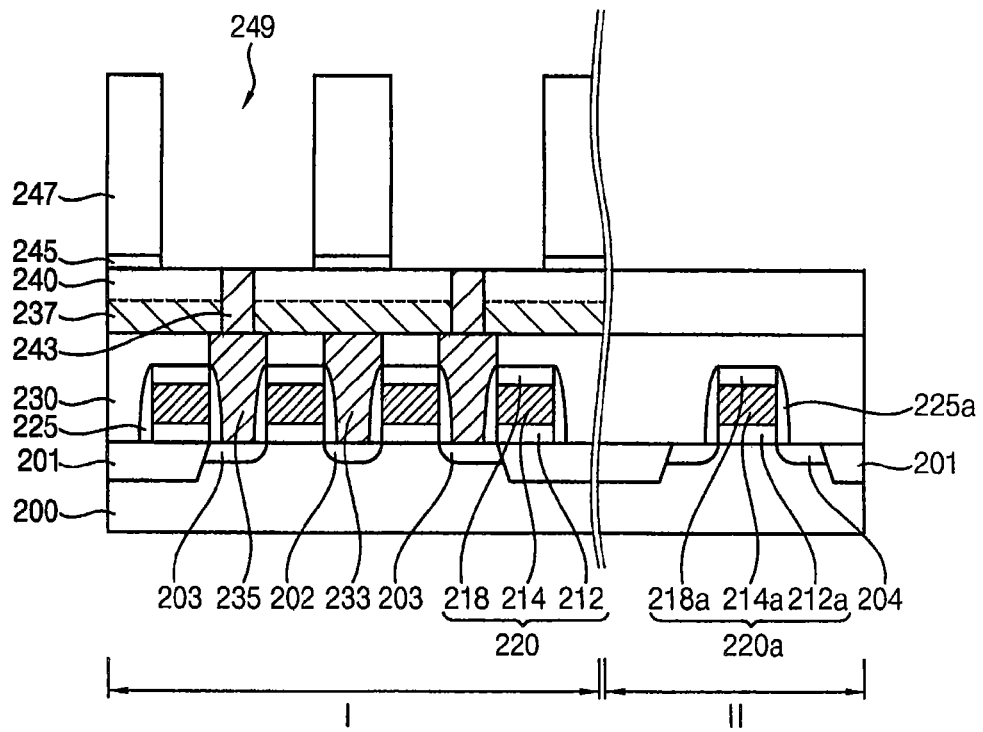

Referring to FIG. 15, an etch stop layer 245 and a mold layer 247 may be sequentially formed on the second insulating interlayer 240, and the mold layer 247 and the etch stop layer 245 may be partially removed to form an opening 249 exposing a top surface of the third contact plug 243. A portion of the mold layer 247 and the etch stop layer 245 in the second region II may be removed. The etch stop layer 245 may be formed to include, e.g., silicon nitride, and the mold layer 247 may be formed to include, e.g., silicon oxide.

Figure 16:
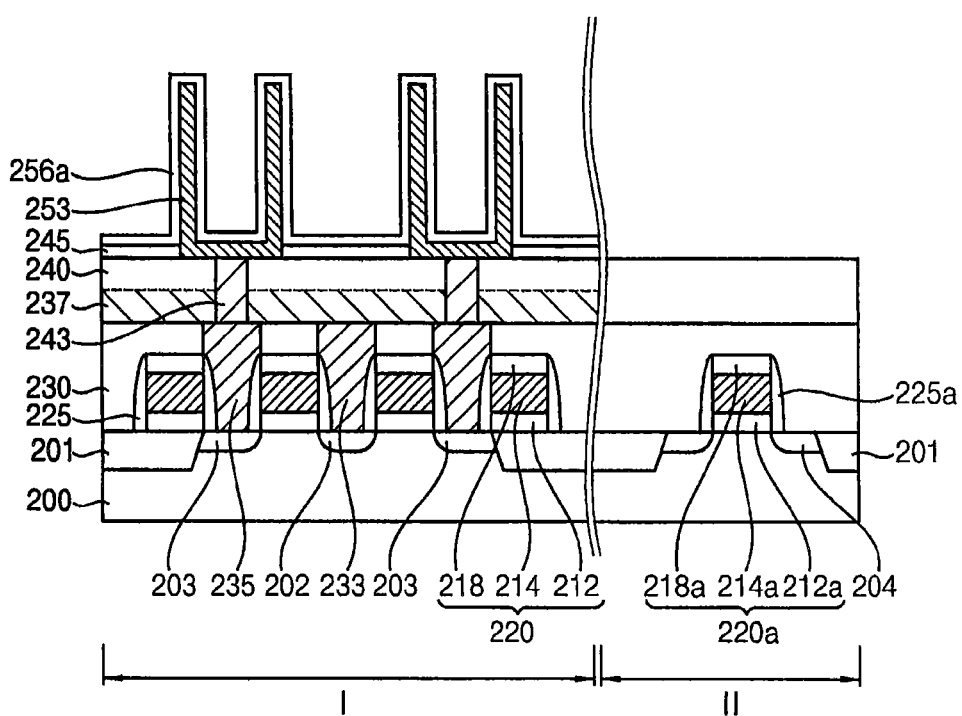

Referring to FIG. 16, a lower electrode 253 may be formed on the exposed top surface of the third contact plug 243, and a sidewall of the opening 249, and a first dielectric layer 256a may be formed on the lower electrode 253 and the etch stop layer 245.

Particularly, a lower electrode layer may be formed on an inner wall of the opening 249 and a top surface of the mold layer 247. The lower electrode layer may be formed to include, e.g., a metal, a metal nitride, a conductive metal oxide, etc. For example, the lower electrode layer may be formed to include a metal, e.g., titanium, tungsten, tantalum, platinum, ruthenium, iridium, etc., a metal nitride, a conductive metal oxide, etc.

A sacrificial layer may be formed on the lower electrode layer, and the sacrificial layer and the lower electrode layer may be partially removed to expose a top surface of the mold layer 247. The sacrificial layer and the lower electrode layer may be removed using, e.g., hydrofluoric acid or buffer oxide etchant (BOE) by a wet etch process to form the lower electrode 253 electrically connected to the third contact plug 243.

A first dielectric layer 256a may be formed on the lower electrode 253 and the etch stop layer 245. In example embodiments, the first dielectric layer 256a may be formed to have a thickness of about 5 Å to about 150 Å.

The first dielectric layer 256a may be formed to include a first metal oxide having a dielectric constant equal to or greater than that of silicon nitride in a crystallized state. For example, the first metal oxide may include e.g., titanium oxide, tantalum oxide, aluminum oxide, hafnium oxide, zirconium oxide, etc. These may be used alone or in a combination thereof. The first dielectric layer 256a may be formed using the first metal oxide by a CVD process, a PVD process, an ALD process, etc.

Figure 17:
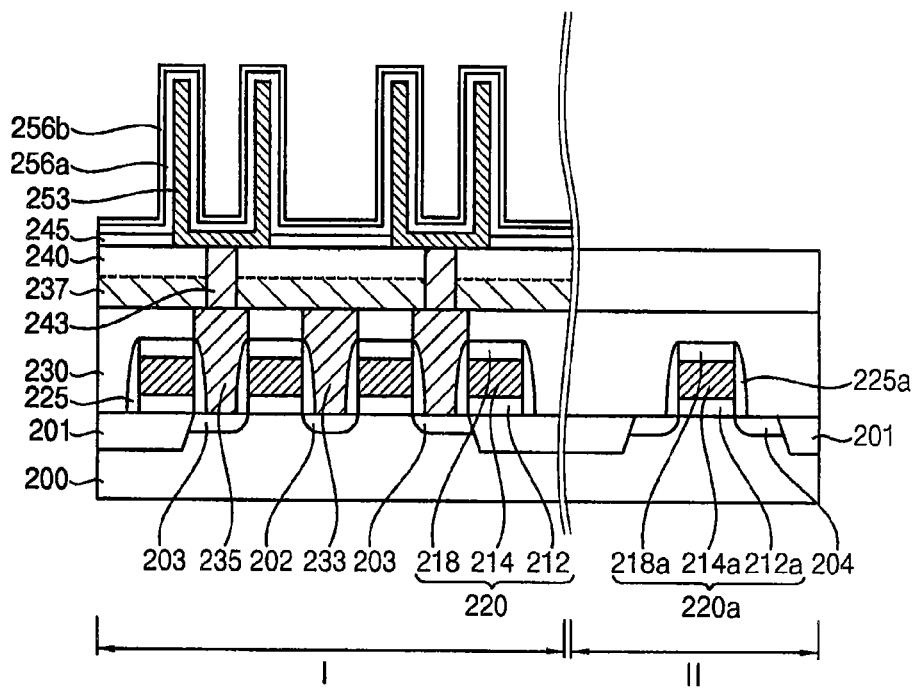

Referring to FIG. 17, a second dielectric layer 256b may be formed on the first dielectric layer 256a.

The second dielectric layer 256b may be formed to have a thickness less than that of the first dielectric layer 256a. In example embodiments, the second dielectric layer 256b may be formed to have a thickness of about 3 Å to about 30 Å. The second dielectric layer 256b may be formed to include a second metal oxide having a dielectric constant that is less than those of the first metal oxide but greater than that of aluminum oxide. For example, the second dielectric layer 256b may be formed to include scandium oxide, lanthanum oxide, etc., by a sputter process, an ALD process, a PVD process, etc.

Figure 18:
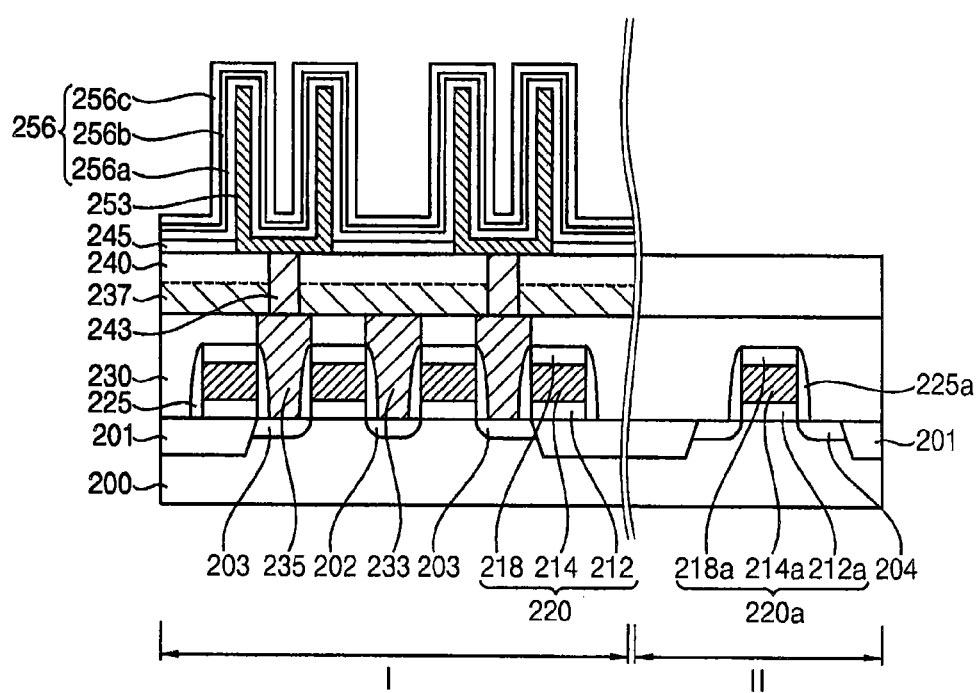

Referring to FIG. 18, a third dielectric layer 256c may be formed on the second dielectric layer 256b.

In example embodiments, the third dielectric layer 256c may be formed to have a thickness of about 5 Å to about 150 Å. The third dielectric layer 256c may be formed to include a third metal oxide having a dielectric constant equal to or greater than that of silicon nitride in a crystallized state. For example, the third metal oxide may include e.g., titanium oxide, tantalum oxide, aluminum oxide, hafnium oxide, zirconium oxide, etc. These may be used alone or in a combination thereof. The third dielectric layer 256c may be formed using the third metal oxide by a CVD process, a PVD process, an ALD process, etc.

In the figure, the dielectric layer structure 256 is shown to include the first, second and third dielectric layers 256a, 256b and 256c, however, the third dielectric layer 256 may be absent.

Figure 19:
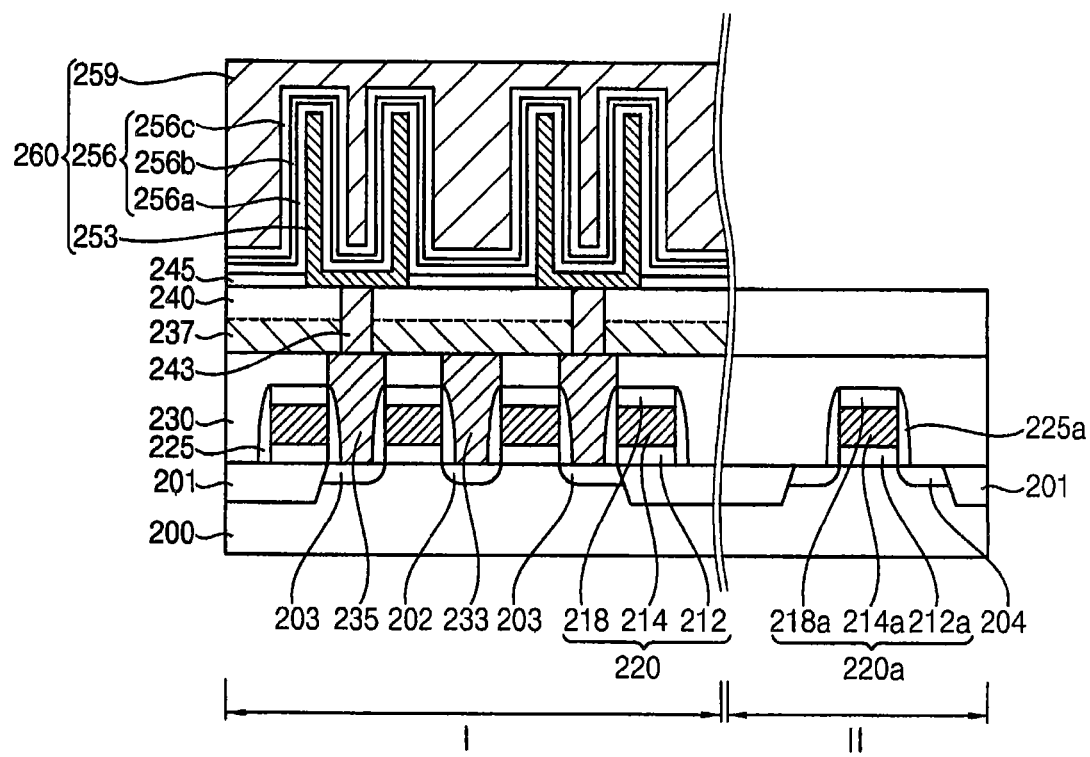

Referring to FIG. 19, an upper electrode 259 may be formed on the dielectric layer structure 256.

The upper electrode 259 may be formed to include a metal, e.g., titanium, tungsten, tantalum, platinum, ruthenium, iridium, etc., a metal nitride and/or a conductive metal oxide. In some embodiments, the upper electrode 259 may be conformally formed on the dielectric layer structure 256. The upper electrode 259 may be formed by a sputtering process, an ALD process, a PVD process, etc.

Thus, the capacitor 260 including the lower electrode 253, the dielectric layer structure 256 and the upper electrode 259 may be formed in the first region I of the substrate 200.

After forming the upper electrode 259, a heat treatment or a plasma treatment may be performed on the dielectric layer structure 256 to crystallize the first and third metal oxides so that first and second crystalline metal oxides may be formed. That is, the first dielectric layer 256a may be treated to include the first crystalline metal oxide, and the third dielectric layer 256c may be treated to include the second crystalline metal oxide. The second metal oxide of the second dielectric layer 256b may not be crystallized. Hereinafter, the second metal oxide may be referred to as an amorphous metal oxide.

Figure 20:
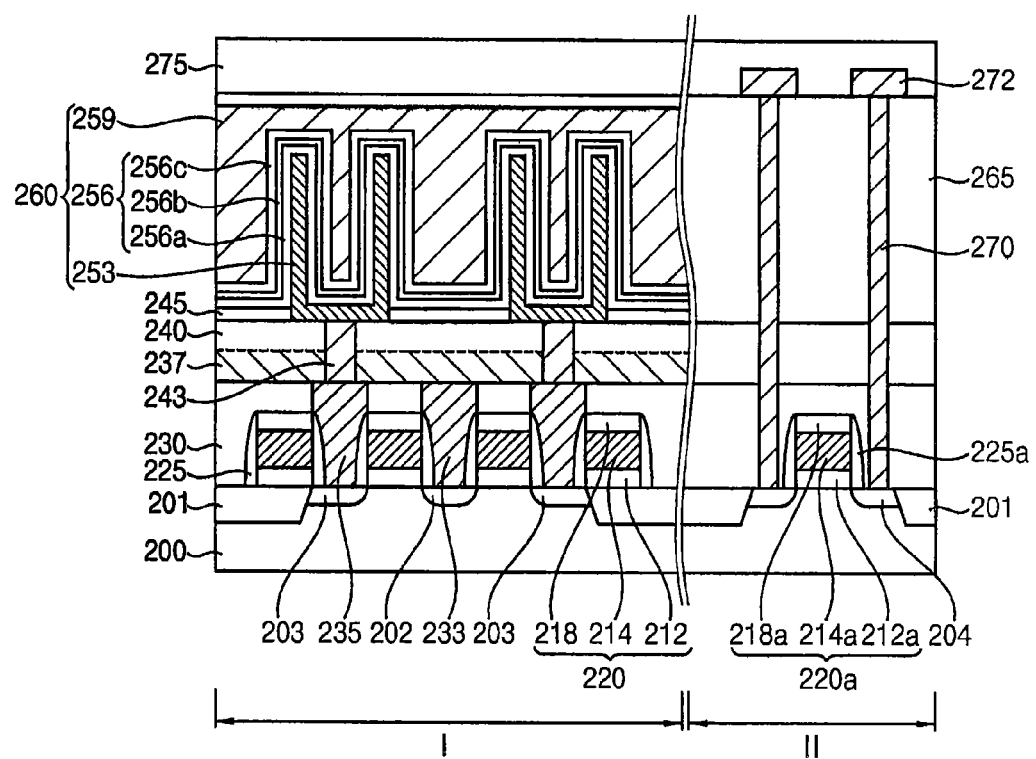

Referring to FIG. 20, a third insulating interlayer 265 may be formed on the second insulating interlayer 240 to cover the capacitor 260.

The third insulating interlayer 265 may be formed using an insulating material, e.g., silicon oxide by a CVD process, a spin coating process, etc. Thus, the third insulating interlayer 265 may cover both of the first and second regions I and II of the substrate 200.

Referring to FIG. 20, a fourth contact plug 27Q and a wiring 272 may be formed to be electrically connected to the peripheral circuits in the second region II of the substrate 200.

Particularly, a third hole may be formed through the first, second and third insulating interlayers 230, 240 and 265 to expose the third impurity region 204. A fourth conductive layer may be formed on the exposed third impurity region 204 and the third insulating interlayer 265 to fill the third hole, and planarized until a top surface of the third insulating interlayer 265 may be exposed to form the fourth contact plug 270 contacting the third impurity region 204. A fifth conductive layer may be formed on the third insulating interlayer 265, and may be patterned to form the wiring 272 contacting the fourth contact plug 270. In example embodiments, the fourth contact plug 270 and the wiring 272 may serve as a portion of the peripheral circuits. An upper insulation layer 275 may be formed on the third insulating interlayer 265 to cover the fourth contact plug 270 and the wiring 272.

The upper insulation layer 275 may be formed using an insulating material, e.g., silicon oxide by a CVD process, a spin coating process, etc. The fourth and fifth conductive layers may be formed using a metal, a metal nitride and/or a metal silicide by a sputtering process, an ALD process, etc.

The semiconductor device may include the second dielectric layer 256b between the first and third dielectric layers 256a and 256c. The second dielectric layer 256b may be formed to contact the first and third dielectric layers 256a and 256c. Thus, grain boundaries may be prevented from being generated in the first and third dielectric layers 256a and 256c, so that a leakage current may be prevented or reduced. Additionally, the second dielectric layer 256b may be formed to include a material having a dielectric constant that is substantially the same as those of the first and third dielectric layers 256a and 256c. For example, the second dielectric layer 256b may include scandium oxide, lanthanum oxide, etc. Thus, the capacitor 260 including the dielectric layer structure 256 may have a high capacitance.

Figure 21:
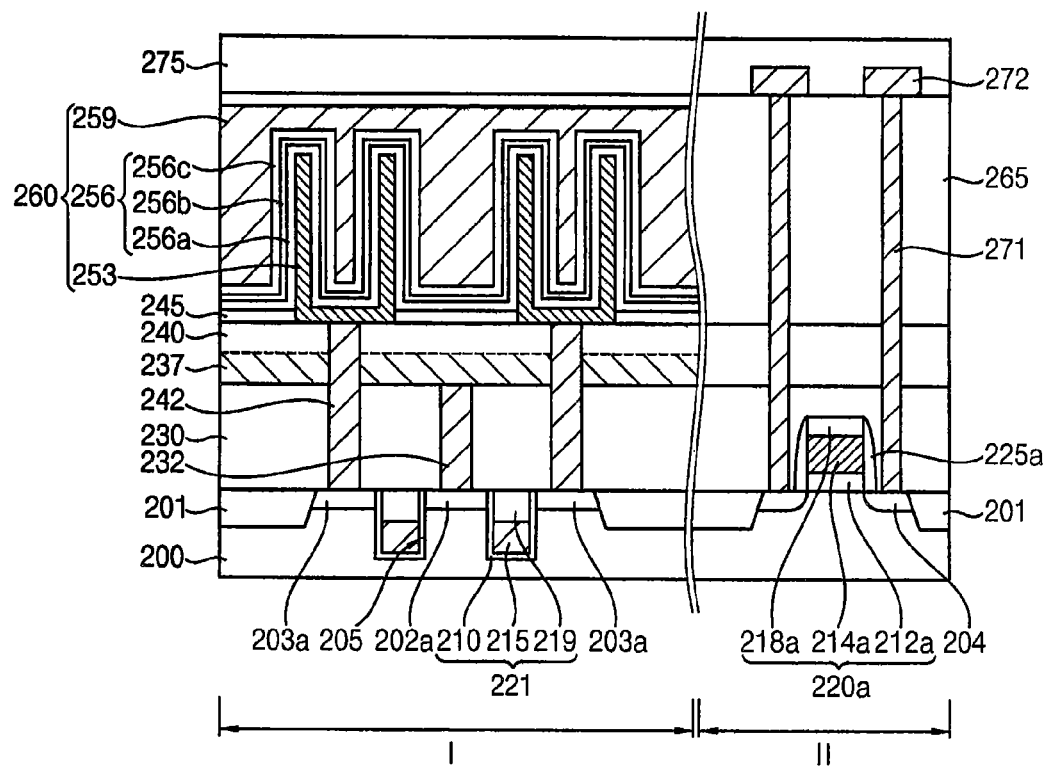
FIG. 21 is a semiconductor device in accordance with example embodiments.

FIG. 21 is a semiconductor device in accordance with example embodiments. The semiconductor device may be substantially the same as or similar to that illustrated with reference to FIG. 10, except for the buried gate structure.

Referring to FIG. 21, the semiconductor device may include a first gate structure 221, first and second impurity regions 202a and 203a, and first and second contact plugs 232 and 242 in a first region I of a substrate 200, and a second gate structure 220a and a third impurity region 204 in a second region II of the substrate 200. The semiconductor device may further include a bit line 237 and a capacitor 260 in the first region I of the substrate 200, and a second gate spacer 225a on a sidewall of the second gate structure 220a, a third contact plug 271 and a wiring 272 in the second region II of the substrate 200.

The first gate structure 221 may be formed in the first region I of the substrate 200. At least a portion of the first gate structure 221 may be buried in the substrate 200. Thus, a portion of the substrate 200 serving as a channel may be increased.

A recess 205 may be formed in the first region I of the substrate 200, and a first gate insulation layer pattern 210 may be formed on an inner wall of the recess 205. A first gate electrode 215 may be formed on the first gate insulation layer pattern 210 to partially fill the recess 205. A first gate mask 219 may be formed on the first gate electrode 215 to fill a remaining portion of the recess 205. Thus, the first gate electrode 215 may be buried in the substrate 200.

Alternatively, the first gate electrode 215 may be partially buried in the substrate 200. In this case, a portion of the first gate electrode 215 may be buried in the substrate 200, and another portion of the first gate electrode 215 may protrude from a top surface of the substrate 200. The first gate mask 219 may be formed on the protruded portion of the first gate electrode 215.

The first and second impurity regions 202a and 203a may be formed at upper portions of the substrate 200 adjacent to the first gate structure 221.

The second gate structure 220a in the second region II of the substrate 200 may be substantially the same as that illustrated with reference to FIG. 10.

The first gate structure 221, the first and second impurity regions 202a and 203a in the first region I of the substrate 200 may form a cell transistor. The second gate structure 220a and the third impurity region 204 in the second region II of the substrate 200 may form a peripheral circuit transistor.

The second gate structure 220a may be covered by a first insulating interlayer 230, and the first contact plug 232 may be formed through the first insulating interlayer 230 to contact a top surface of the first impurity region 202a. The first insulating interlayer 230 may include an insulating material, e.g., silicon oxide, and the first contact plug 232 may include, e.g., a metal, a metal nitride, a metal silicide, etc.

The bit line 237 may be formed on the first insulating interlayer 230 to contact a top surface of the first contact plug 232. The bit line 237 may be covered by a second insulating interlayer 240, and the second insulating interlayer 240 may be formed on the first insulating interlayer 230. The bit line 237 may include, e.g., a metal, a metal nitride, a metal silicide, and the second insulating interlayer 240 may include an insulating material, e.g., silicon oxide.

The second contact plug 242 may be formed through the first and second insulating interlayers 230 and 240 to contact the second impurity region 203a. The second contact plug 242 may include a metal, a metal nitride, a metal silicide, etc.

An etch stop layer 245 (that exposes the second contact plug 242) may be formed on the second insulating interlayer 240. The etch stop layer 245 may include, e.g., silicon nitride.

The capacitor 260 may be electrically connected to the second contact plug 242. The capacitor 260 may include a lower electrode 253, a dielectric layer structure 256 and an upper electrode 259 sequentially stacked. The lower electrode 253 may contact a top surface of the second contact plug 242. The dielectric layer structure 256 may be formed on the etch stop layer 245 and the lower electrode 253, and the upper electrode 259 may be formed on the dielectric layer structure 256.

The lower and upper electrodes 253 and 259 may include a metal, e.g., titanium, tungsten, tantalum, platinum, ruthenium, iridium, etc., a conductive metal oxide and/or a metal nitride.

The dielectric layer structure 256 may include first, second and third dielectric layers 256a, 256b and 256c sequentially stacked. The first and third dielectric layers 256a and 256c may include first and second crystalline metal oxides, respectively, each of which may have a dielectric constant equal to or greater than that of silicon nitride in a crystallized state. In example embodiments, the first and third dielectric layers 256a and 256c may include, e.g., titanium oxide, tantalum oxide, aluminum oxide, hafnium oxide, zirconium oxide, etc. The second dielectric layer 256b may include an amorphous metal oxide having a dielectric constant that is less than those of the first and second crystalline metal oxides but greater than that of aluminum oxide. For example, the second dielectric layer 256b may include scandium oxide, lanthanum oxide, etc. FIG. 21 shows the dielectric layer structure 256 including the first, second and third dielectric layers 256a, 256b and 256c, however, the third dielectric layer 256c may be absent in some embodiments.

A third insulating interlayer 265 may be formed on the second insulating interlayer 240 and cover the capacitor 260. The third insulating interlayer 265 may include, e.g., silicon oxide.

The third contact plug 271 may be formed through the first, second and third insulating interlayers 230, 240 and 265 to contact the third impurity region 204 in the second region II of the substrate 200. The wiring 272 may be formed on the third insulating interlayer 265 to contact the third contact plug 271. The wiring 272 and the third contact plug 271 may be a portion of peripheral circuits. The third contact plug 271 and the wiring 272 may include, e.g., a metal, a metal nitride, a metal silicide, etc.

In the semiconductor device in accordance with example embodiments, the second dielectric layer 256b may be formed between the first and third dielectric layers 256a and 256c to include a material having a dielectric constant that is substantially the same as those of the first and third dielectric layers 256a and 256c. Thus, no or very little grain boundaries may be formed in the dielectric layer structure 256 so as to prevent the leakage current, and the capacitor 260 including the dielectric layer structure 256 may have a high capacitance.

FIGS. 22 to 32 are cross-sectional views illustrating the formation of a semiconductor device in accordance with example embodiments. This method may be used for manufacturing the semiconductor device of FIG. 21, however, may not be limited thereto. This method may include processes substantially the same as or similar to those illustrated with reference to FIGS. 11 to 2Q.

Figure 22:
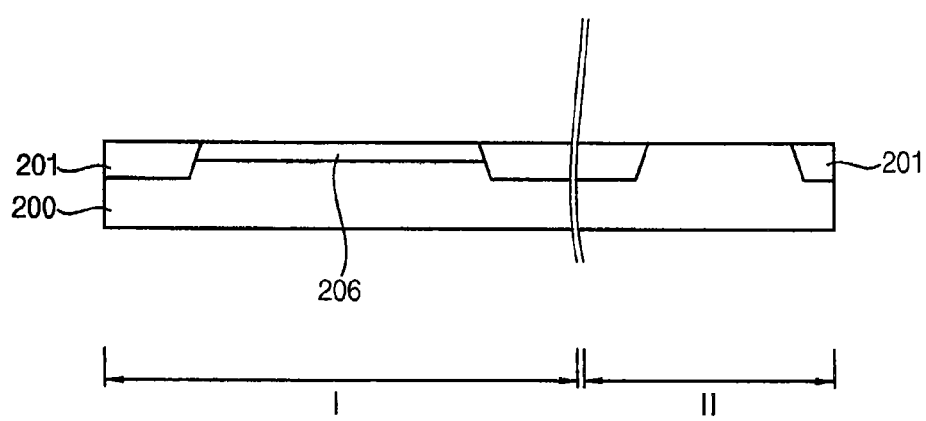
FIGS. 22 to 32 are cross-sectional views illustrating the formation of a semiconductor device in accordance with example embodiments.

Referring to FIG. 22, after forming a preliminary impurity region 206 at an upper portion of the substrate 200 in the first region I, an isolation layer 201 may be formed.

Particularly, the preliminary impurity region 206 may be formed by an ion implantation process. The isolation layer 201 may be formed by an STI process. The substrate 200 may be divided into an active region and a field region by the isolation layer 201.

Figure 23:
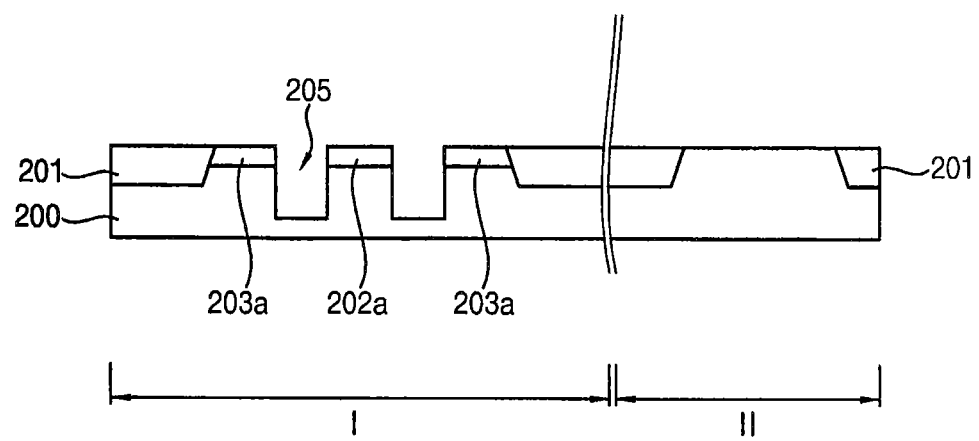

Referring to FIG. 23, the preliminary impurity region 206 and the substrate 200 may be partially removed to form a recess 205.

Particularly, a mask pattern exposing a portion of the substrate 200 in the first region I may be formed on the substrate 200 and the isolation layer 201, and a dry etch process may be performed using the mask pattern as an etching mask to form the recess 205. The mask pattern may be removed by an ashing process and/or a stripping process. Thus, first and second impurity regions 202a and 203a divided by the recess 205 may be formed.

Figure 24:
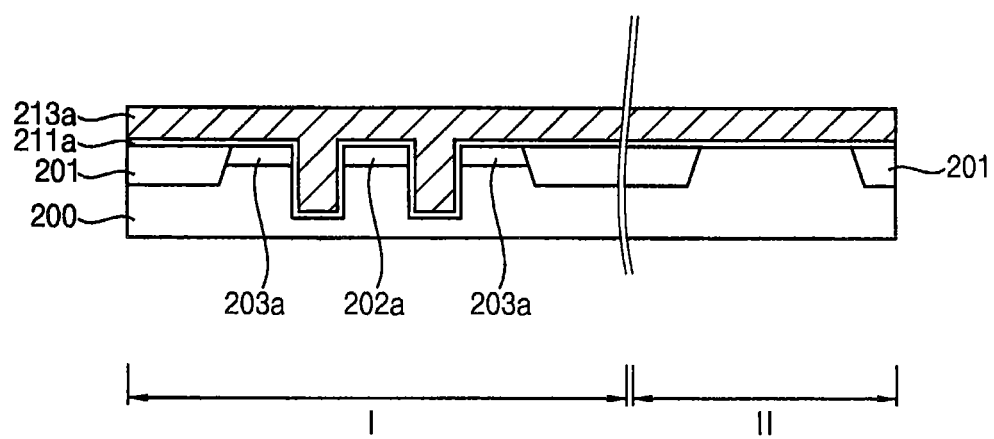

Referring to FIG. 24, a first gate insulation layer 211a may be formed on the substrate 200 and an inner wall of the recess 205, and a first gate electrode layer 213a may be formed on the first gate insulation layer 211 a to fill the recess 205.

The first gate insulation layer 211a may be formed using silicon oxide or a metal oxide by a CVD process, a spin coating process, etc., and the first gate electrode layer 213a may be formed using a metal and/or a metal nitride by an ALD process, a PVD process, etc.

Figure 25:
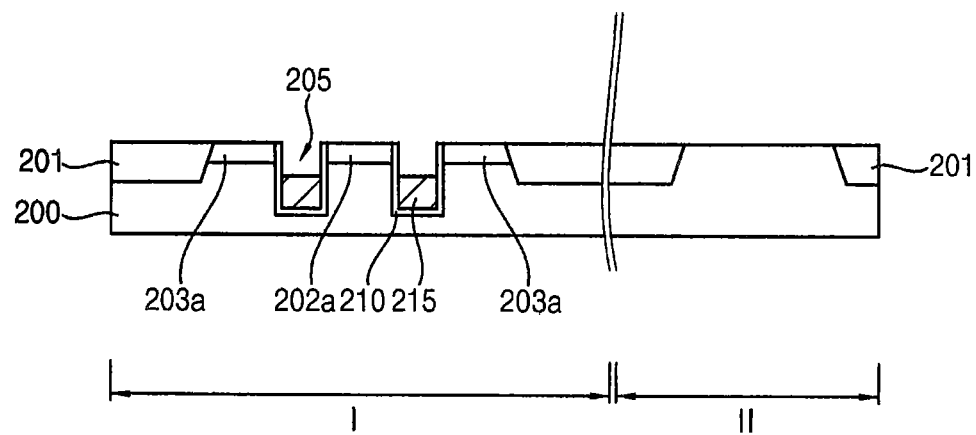

Referring to FIG. 25, upper portions of the first gate insulation layer 211a and the first gate electrode layer 213a may be removed to form first gate insulation layer pattern 210 and a first gate electrode 215, respectively.

Particularly, the upper portions of the gate insulation layer 211a and the first gate electrode layer 213a may be planarized by a CMP process until a top surface of the substrate 200 may be exposed. Thus, the first gate insulation layer pattern 210 may be formed on the inner wall of the recess 205. An upper portion of the first gate electrode layer 213a may be further removed by an etch back process to form the first gate electrode 215 in the recess 205.

Alternatively, the first gate electrode 215 may be formed to be partially buried in the recess 205 and partially protrude from the recess 205. In this case, after forming the first gate insulation layer pattern 210 on the inner wall of the recess 205, a gate electrode layer filling the recess 205 may be formed on the substrate 200. The gate electrode layer 213a may be patterned to form the first gate electrode 215 having a protrusion.

Figure 26:
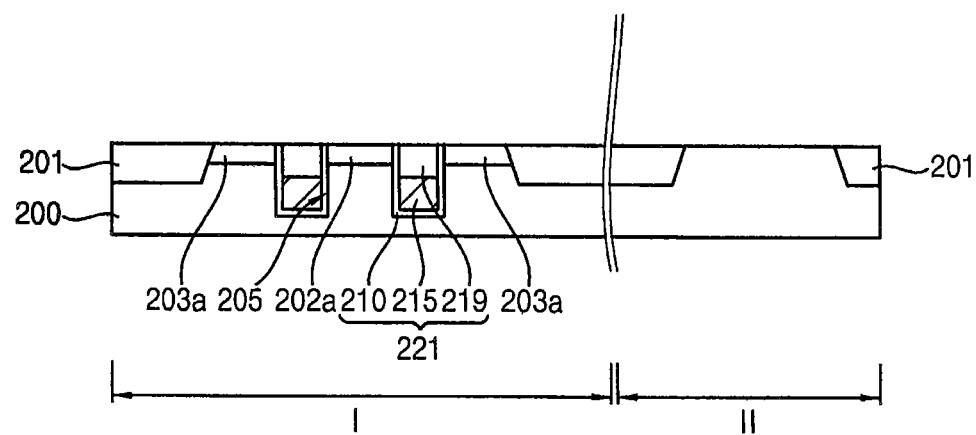

Referring to FIG. 26, a first gate mask 219 may be formed on the first gate electrode 215.

Particularly, a first gate mask layer may be formed on the first gate electrode 215 and the substrate 200 to fill a remaining portion of the recess 205, and planarized until a top surface of the substrate 200 may be exposed to form the first gate mask 219. Thus, a first gate electrode 221 including the first gate insulation layer pattern 210, the first gate electrode 215 and the first gate mask 219 may be formed in the first region I of the substrate 200. The first gate mask layer may be formed using, e.g., silicon nitride, silicon oxynitride, etc., by a CVD process, a spin coating process, etc.

Figure 27:
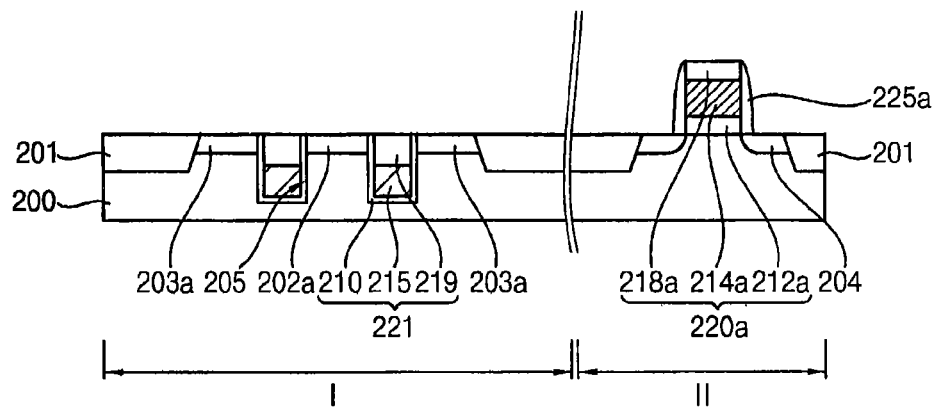

Referring to FIG. 27, a second gate structure 220a may be formed in the second region II of the substrate 200.

Particularly, a second gate insulation layer, a second gate electrode layer and a second gate mask may be sequentially formed on the substrate 200 in the second region II, and may be patterned to form the second gate structure 220a including a second gate insulation layer pattern 212a, a second gate electrode 214a and a second gate mask 218a sequentially stacked. In example embodiments, the second gate insulation layer pattern 212a, the second gate electrode 214a and the second gate mask 218a may include substantially the same materials as those of the first gate insulation layer pattern 210, the first gate electrode 215 and the first gate mask 219, respectively.

Impurities may be implanted into a portion of the substrate 200 in the second region II using the second gate structure 220a as an ion implantation mask to form a third impurity region 204. A spacer layer may be formed on the substrate 200 to cover the second gate structure 220a and anisotropically etched to form a second gate spacer 225a on a sidewall of the second gate structure 220a.

Alternatively, the second gate structure 220a may be formed buried in the substrate 200 similar to the first gate structure 221. In this case, a recess may be formed on a portion of the substrate 200 in the second region II, and the first and second gate structures 221 and 220a may be formed simultaneously.

Figure 28:
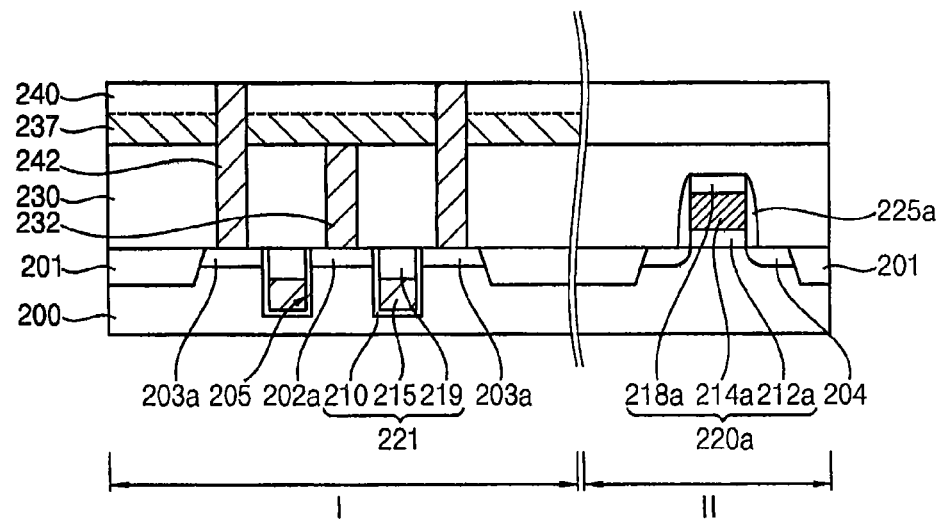

Referring to FIG. 28, a first insulating interlayer 230 may be formed on the substrate 200 to cover the first and second gate structures 221 and 220a. A first contact plug 232 may be formed through the first insulating interlayer 230 to contact the first impurity region 202a, and a bit line 237 may be formed on the first insulating interlayer 230 to be electrically connected to the first contact plug 232.

A second insulating interlayer 240 may be formed on the first insulating interlayer 230 to cover the bit line 237, and a second contact plug 242 may be formed through the first and second insulating interlayers 230 and 240 to be electrically connected to the second impurity region 203a.

The first and second insulating interlayers 230 and 240 may be formed using an insulating material, e.g., silicon oxide by a CVD process. The first and second contact plugs 232 and 242 and the bit line 237 may be formed using a metal, e.g., tungsten, copper, aluminum, etc., and/or a metal nitride.

Figure 29:
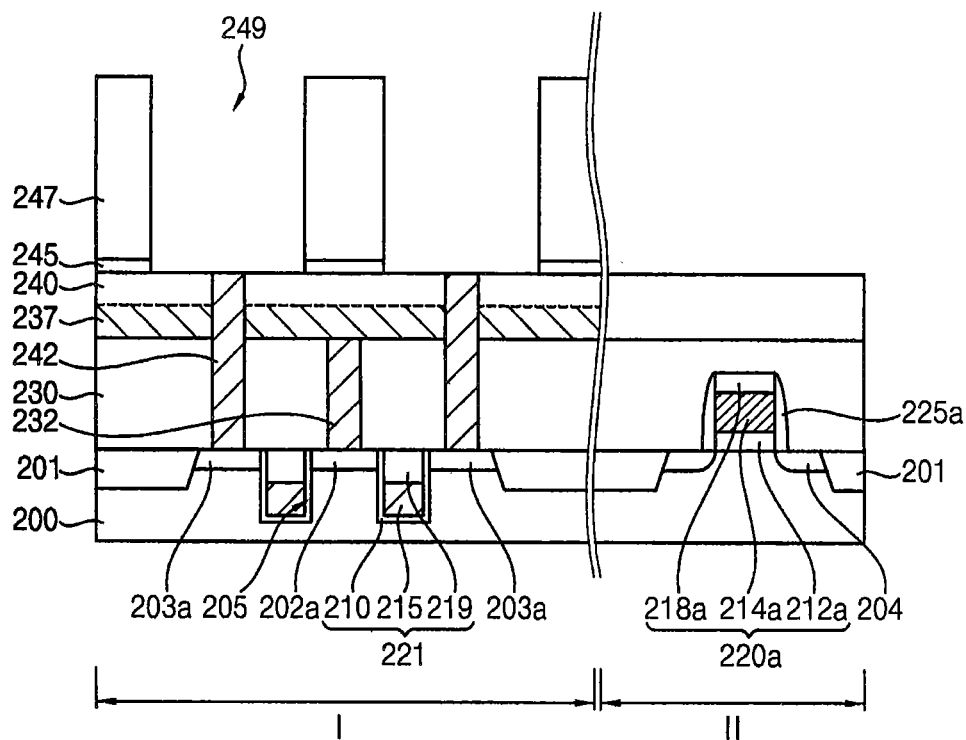

Referring to FIG. 29, a process substantially the same as or similar to that illustrated with reference to FIG. 15 may be performed.

Figure 30:
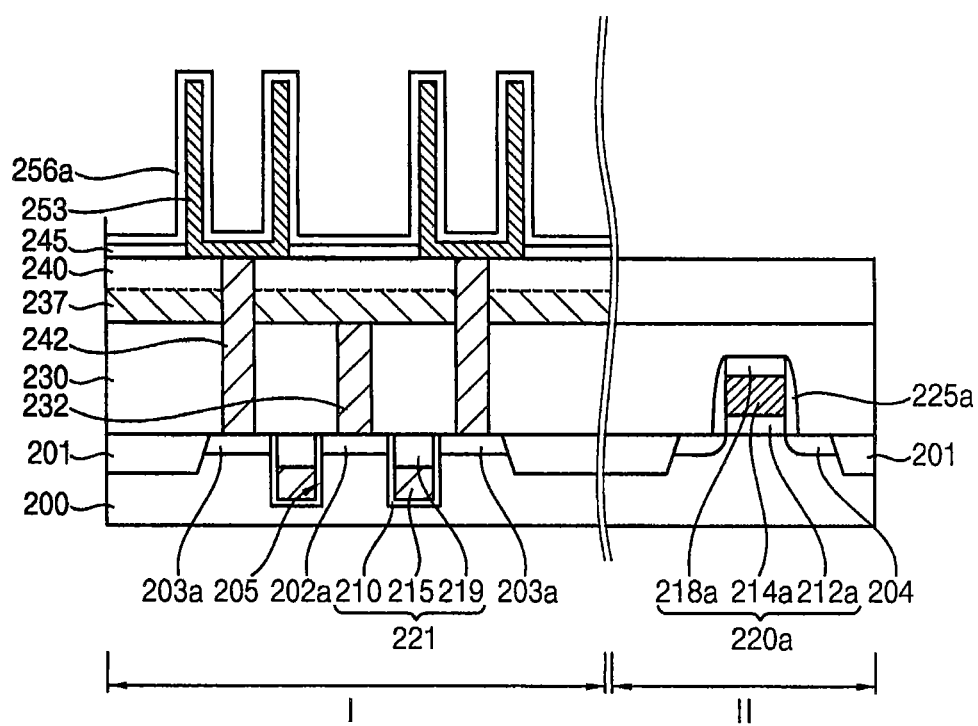

That is, an etch stop layer 245 and a mold layer 247 may be sequentially formed on the second insulating interlayer 240, and the mold layer 247 and the etch stop layer 245 may be partially removed to form an opening 249 exposing a top surface of the second contact plug 242. Referring to FIG. 30, a process substantially the same as or similar to that illustrated with reference to FIG. 16 may be performed.

That is, a lower electrode 253 may be formed on the exposed top surface of the second contact plug 242, and a sidewall of the opening 249, and a first dielectric layer 256a may be formed on the lower electrode 253 and the etch stop layer 245. The first dielectric layer 256a may be formed to have a thickness of about 5 Å to about 150 Å.

Figure 31:
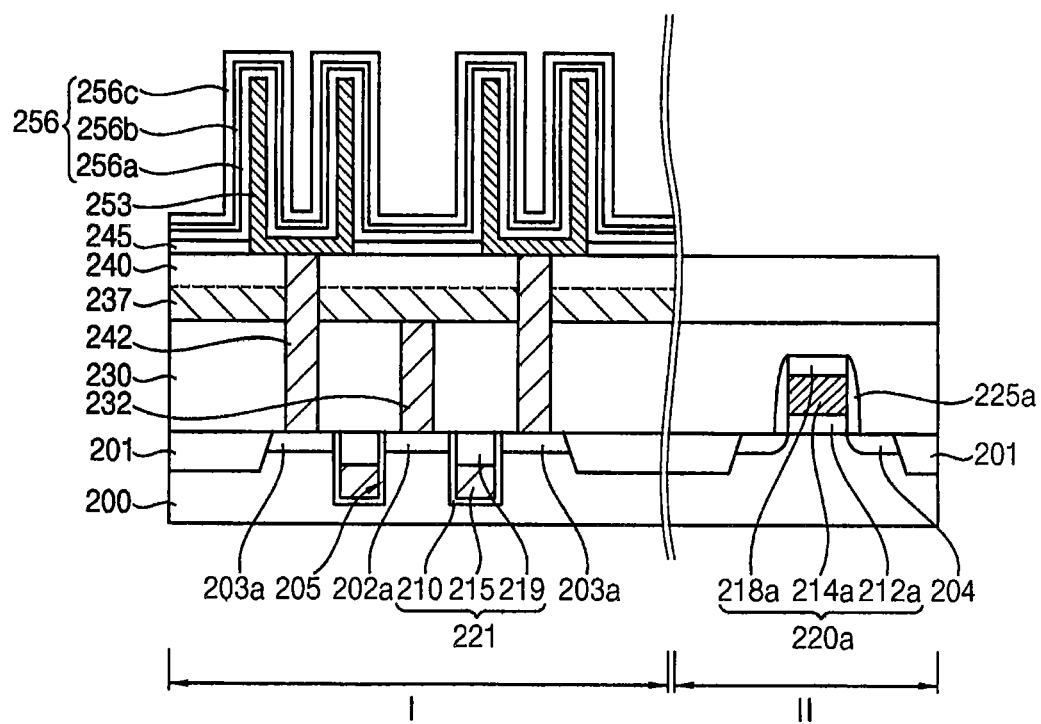

Referring to FIG. 31, processes substantially the same as or similar to those illustrated with reference to FIGS. 17 and 18 may be performed.

That is, a second dielectric layer 256b and a third dielectric layer 256c may be sequentially formed on the first dielectric layer 256a.

In example embodiments, the second dielectric layer 256b may be formed to have a thickness less than that of the first dielectric layer 256a. For example, the second dielectric layer 256b may be formed to include scandium oxide, lanthanum oxide, etc., by a sputter process, an ALD process, a PVD process, etc. In some embodiments, the third dielectric layer 256c may not be formed.

Thus, a dielectric layer structure 256 including the first, second and third dielectric layers 256a, 256b and 256c may be formed.

Figure 32:
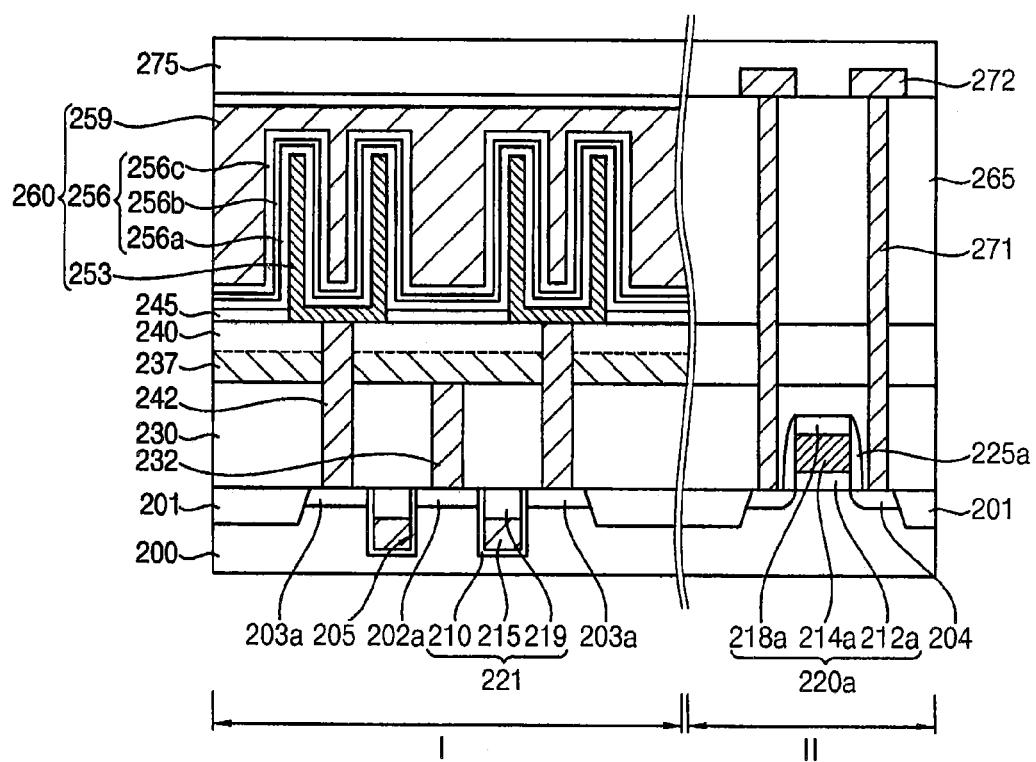

Referring to FIG. 32, processes substantially the same as or similar to those illustrated with reference to FIGS. 19 and 20.

That is, an upper electrode 259 may be formed on the dielectric layer structure 256, and thus a capacitor 260 may be formed to be electrically connected to the second contact plug 242 in the first region I of the substrate 200. A third insulating interlayer 265 may be formed on the second insulating interlayer 240 to cover the capacitor 260, and a third contact plug 271 may be formed through the first, second and third insulating interlayers 230, 240 and 265 to be electrically connected to the third contact plug 271 in the second region II of the substrate 200. A wiring 272 may be formed on the third insulating interlayer 265 to be electrically connected to the third contact plug 271, and an upper insulation layer 275 may be formed on the third insulating interlayer 265 to cover the wiring 272.

In the semiconductor device in accordance with example embodiments, the second dielectric layer 256b may be formed between the first and third dielectric layers 256a and 256c to include a material having a dielectric constant that is substantially the same as those of the first and third dielectric layers 256a and 256c. Thus, no or very little grain boundaries may be formed in the dielectric layer structure 256 so as to prevent the leakage current, and the capacitor 260 including the dielectric layer structure 256 may have a high capacitance.

According to example embodiments, a dielectric layer structure of a capacitor may have a dielectric layer including amorphous scandium oxide or amorphous lanthanum oxide. Due to the dielectric layer, a DRAM may have a reduced leakage current and the capacitor may have a high capacitance. The dielectric layer may be also used in other types of semiconductor devices to enhance the characteristics thereof.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed:
1. A capacitor, comprising:
a lower electrode on a substrate;
a dielectric layer structure, including:
    a first dielectric layer on the lower electrode, the first dielectric layer including a first crystalline metal oxide; and a second dielectric layer on the first dielectric layer, the second dielectric layer including an amorphous metal oxide having a dielectric constant less than that of the first dielectric layer and greater than that of aluminum oxide; and an upper electrode on the dielectric layer structure.

2. The capacitor of claim 1, further comprising a third dielectric layer on the second dielectric layer, the third dielectric layer including a second crystalline metal oxide, wherein the second dielectric layer has a dielectric constant less than that of the third dielectric layer.

3. The capacitor of claim 2, wherein the first and second crystalline metal oxides include any one selected from the group consisting of titanium oxide, tantalum oxide, aluminum oxide, hafnium oxide and zirconium oxide.

4. The capacitor of claim 2, wherein the second dielectric layer has a thickness less than respective thicknesses of the first and third dielectric layers.

5. The capacitor of claim 4, wherein each of the first and third dielectric layers has a thickness of about 5 Å to about 150 Å, and the second dielectric layer has a thickness of about 3 Å to about 30 Å.

6. The capacitor of claim 1, wherein the amorphous metal oxide includes lanthanum oxide or scandium oxide.

7. The capacitor of claim 1, wherein each of the lower and upper electrodes includes any one selected from the group consisting of titanium, tungsten, tantalum, platinum, ruthenium, iridium, and an oxide thereof.

8. A method of forming a capacitor, the method comprising:

forming a lower electrode on a substrate;

forming a dielectric layer structure on the lower electrode, the dielectric layer structure including a first dielectric layer and a second dielectric layer sequentially stacked, the first dielectric layer containing a first metal oxide, and the second dielectric layer containing a second metal oxide having a dielectric constant less than that of the first metal oxide in a crystallized state and greater than that of aluminum oxide; and forming an upper electrode on the dielectric layer structure.

9. The method of claim 8, wherein forming the dielectric layer structure further includes forming a third dielectric layer on the second dielectric layer using a third metal oxide.

10. The method of claim 9, wherein the third metal oxide includes a material substantially the same as the first metal oxide.

11. The method of claim 9, wherein the second dielectric layer is formed to have a thickness that is less than respective thicknesses of the first and third dielectric layers.

12. The capacitor of claim 11, wherein each of the first and third dielectric layers is formed to have a thickness of about 5 Å to about 150 Å, and the thickness of the second dielectric layer is formed to about 3 Å to about 30 Å.

13. The method of claim 9, further comprising, after forming the upper electrode, performing a heat treatment or a plasma treatment on the dielectric layer structure to crystallize the first and third metal oxides.

14. The method of claim 8, wherein the amorphous metal oxide includes lanthanum oxide or scandium oxide.

15. The capacitor of claim 8, wherein each of the lower and upper electrodes is formed to include any one selected from the group consisting of titanium, tungsten, tantalum, platinum, ruthenium, iridium, an oxide thereof, and a nitride thereof.

16. A capacitor, comprising:

a crystallized metal oxide dielectric layer having a first dielectric constant; and an amorphous metal oxide dielectric layer on the crystallized metal oxide dielectric layer, the amorphous metal oxide dielectric layer having a second dielectric constant that is less the first dielectric constant and is greater than a dielectric constant of aluminum oxide.

17. The capacitor of claim 16 wherein the crystallized metal oxide dielectric layer comprises a first crystallized metal oxide dielectric layer, the capacitor further comprising:

a second crystallized metal oxide dielectric layer on the amorphous metal oxide dielectric layer opposite the first crystallized metal oxide dielectric layer.

18. The capacitor of claim 17 wherein the first and second crystallized metal oxide dielectric layers each have a respective thickness of about 5 Å to about 150 Å, and wherein the amorphous metal oxide dielectric layer has a thickness of about 3 Å to about 30 Å.

19. The capacitor of claim 16 wherein the first dielectric constant is greater than a dielectric constant of SiN.

20. The capacitor of claim 16 wherein the amorphous metal oxide dielectric layer comprises lanthanum oxide or scandium oxide.

* * * * *